US012099086B2

(12) United States Patent
Cai et al.

(10) Patent No.: US 12,099,086 B2
(45) Date of Patent: Sep. 24, 2024

(54) FCM BASED CHIPLET TEST CIRCUIT

(71) Applicants: Nanjing University of Posts and Telecommunications, Jiangsu (CN); Nantong Institute of Nanjing University of Posts and Telecommunications Co., Ltd., Jiangsu (CN)

(72) Inventors: Zhikuang Cai, Jiangsu (CN); Jian Song, Jiangsu (CN); Guopeng Zhou, Jiangsu (CN); Zushuai Xie, Jiangsu (CN); Henglu Wang, Jiangsu (CN); Binbin Xu, Jiangsu (CN); Jiafei Yao, Jiangsu (CN); Zixuan Wang, Jiangsu (CN); Yufeng Guo, Jiangsu (CN)

(73) Assignees: Nanjing University of Posts and Telecommunications, Jiangsu (CN); Nantong Institute of Nanjing University of Posts and Telecommunications Co., Ltd., Jiangsu (CN)

( * ) Notice: Subject to any disclaimer, the term of this patent is extended or adjusted under 35 U.S.C. 154(b) by 0 days.

(21) Appl. No.: 18/027,370

(22) PCT Filed: Oct. 20, 2022

(86) PCT No.: PCT/CN2022/126328
§ 371 (c)(1),
(2) Date: Mar. 21, 2023

(87) PCT Pub. No.: WO2023/231276
PCT Pub. Date: Dec. 7, 2023

(65) Prior Publication Data
US 2024/0288492 A1    Aug. 29, 2024

(30) Foreign Application Priority Data
Oct. 9, 2022  (CN) .................. 202211224306.6

(51) Int. Cl.
*G01R 31/28* (2006.01)
(52) U.S. Cl.
CPC .............................. *G01R 31/2884* (2013.01)
(58) Field of Classification Search
CPC ................................................. G01R 31/2884
(Continued)

(56) References Cited

U.S. PATENT DOCUMENTS 11,322,474 B2 * 5/2022 Lo ........................ H01L 23/5386
11,500,017 B1 * 11/2022 Lin .................. G01R 31/31726
11,808,805 B1 * 11/2023 Da Silva ............ G01R 31/2853

OTHER PUBLICATIONS

Jean Durupt et al., "IJTAG supported 3D DFT using Chiplet-Footprints for testing Multi-Chips Active Interposer System", 2016 21st IEEE European Test Symposium (ETS), May 2016, pp. 1-6.
(Continued)

*Primary Examiner* — Giovanni Astacio-Oquendo
(74) *Attorney, Agent, or Firm* — JCIPRNET

(57) ABSTRACT

The present disclosure relates to the field of design for testability of super-large-scale integrated circuits, and discloses a flexible configurable module (FCM) based chiplet test circuit. The core structure of the circuit is located at an interposer. The test circuit includes FCMs, a control signal configuration module and a test state control module, where the FCM adopts a two-way skew-symmetric structure to implement data transmission in the horizontal direction and the vertical direction; the control signal configuration module is connected to control signals of all the FCMs, so as to control the data transmission directions as well as switch on and switch off states of all the FCMs; and the test state control module controls the shift and update operations of data inside the FCMs and the control signal configuration module.

18 Claims, 16 Drawing Sheets

(58) Field of Classification Search
USPC .................................. 324/762.01, 537, 500
See application file for complete search history.

(56) References Cited

OTHER PUBLICATIONS

Yassine Fkih et al., "A JTAG based 3D DFT architecture using automatic die detection", Proceedings of the 2013 9th Conference on Ph.D. Research in Microelectronics and Electronics (Prime), Jun. 2013, pp. 341-344.
Erik Jan Marinissen et al., "A Structured and Scalable Test Access Architecture for TSV-Based 3D Stacked ICs", 2010 28th VLSI Test Symposium (VTS), Apr. 2010, pp. 269-274.

* cited by examiner

| Data transmission direction of FCM | Port name | Connecting port of FCM | Enable valve |
|---|---|---|---|
| Self-locking signal 1 | self_locking_1 | self_locking_1 | 1 |
| From FCM_Bottom_Y to FCM_Top_Y, register and latch excluded mode | FCM_Bottom_En1 | u0 | 1 |
| | FCM_Bottom_En2 | u1 | 0 |
| | FCM_Top_En1 | u2 | 1 |
| | FCM_Top_En2 | u3 | 0 |
| | From_Left_En1 | u4 | 1 |
| | From_Left_En2 | u5 | 0 |
| | To_Right_En1 | u6 | 0 |
| | To_Right_En2 | u7 | 0 |
| | From_Right_En1 | u8 | 1 |
| | From_Right_En2 | u9 | 1 |
| | To_Left_En2 | u10 | 0 |
| | To_Left_En1 | u11 | 1 |
| Self-locking signal 2 | self_locking_2 | self_locking_2 | 1 |

FIG. 7

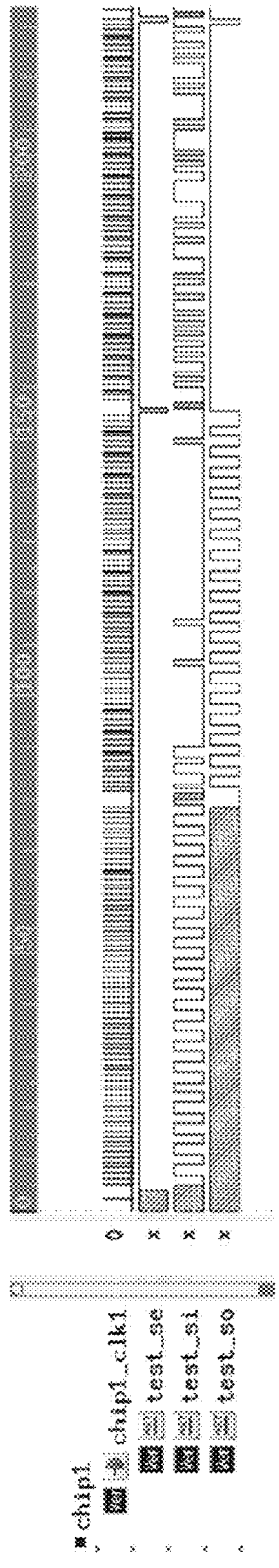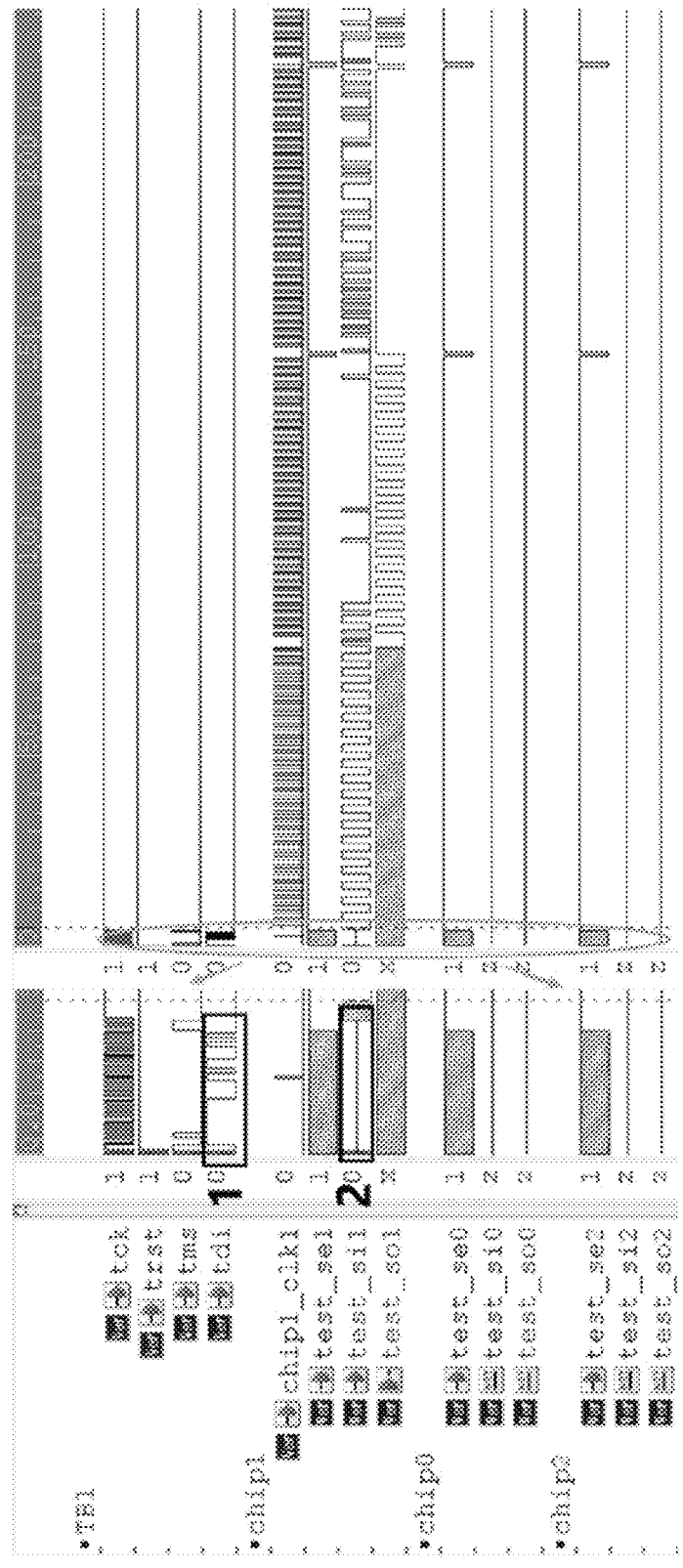
FIG. 10(a)
FIG. 10(b)

FCM BASED CHIPLET TEST CIRCUIT

CROSS-REFERENCE TO RELATED APPLICATION

This application is a 371 of international application of PCT application serial no. PCT/CN2022/126328, filed on Oct. 20, 2022, which claims the priority benefit of China application no. 202211224306.6, filed on Oct. 9, 2022. The entirety of each of the above mentioned patent applications is hereby incorporated by reference herein and made a part of this specification.

BACKGROUND

1. Technical Field

The present disclosure relates to the field of design for testability of super-large-scale integrated circuits, and particularly relates to a flexible configurable module (FCM) based chiplet test circuit.

2. Description of Related Art

On Mar. 2, 2022, Intel joined forces with ten chip giants such as TSMC, Samsung, and AMD, etc., to establish the Chiplet Standard Alliance which officially launched the Universal Chiplet Interconnect Express UCIe for connecting various chip link protocols to build an open and interoperable Chiplet ecosystem. On March 9 of the same year, Apple Inc announced a M1 Ultra processor based on a fifth-generation Chip on Wafer on Substrate (CoWoS) of TSMC, which verified the commercial value and unlimited potential of the Chiplet technology once again.

In the Chiplet heterogeneous integration technology, by integrating a plurality of modular mini-chips (mainly in the form of bare chips) in one package by means of an internal interconnection technology, a dedicated functional heterogeneous chip is formed, thereby solving the problems of scale, development cost, cycle and the like involved in chip development. By adopting advanced packaging technologies such as 2.5D and 3D and the like, chiplets can achieve high-performance multi-chip on-chip interconnection, which improves the integration level of a chip system, expands the performance of the chip system, reduces the power consumption, optimizes the space, and cracks existing physical limitations and material limitations of integrated circuit development.

The current chiplet technology is faced with numerous challenges, one key challenge of which is the testability of chiplets. Compared with single-chip integration, a chiplet packages a plurality of bare chips that may come from different manufacturers together, and different manufacturers have different test requirements and test specifications, and thus, how to achieve greater interoperability between different chips and test structures of different suppliers is an important challenge currently faced.

Many explorations on the testing of 2.5D and 3D chips have been made in industrial circles and academic circles, such as: in a literature [J. Durupt, P. Vivet and J. Schloeffel. IJTAG supported 3D DFT using chiplet-footprints for testing multi-chips active interposer system[C]. 2016 21th IEEE European Test Symposium (ETS), 2016, pp. 1-6.], a 3D DFT (Design For Test) test circuit is put forward based on the IEEE 1687 standard to test multi-chips stacked on an active interposer; in a literature [Y. Fkih, P. Vivet and B. Rouzeyre, et al. A JTAG based 3D DfT architecture using automatic die detection[C]. Proceedings of the 2013 9th Conference on Ph.D. Research in Microelectronics and Electronics (PRIME), 2013, pp. 341-344.], an automatic chip test circuit with a 3D DFT architecture is proposed for 3D interconnection testing based on the IEEE 1149.1 standard; and in a literature [E. J. Marinissen, J. Verbree and M. Konijnenburg. A structured and scalable test access architecture for TSV-based 3D stacked ICs[C]. 2010 28th VLSI Test Symposium (VTS), 2010, pp. 269-274.], a structured and scalable test access architecture for TSV-based 3D stacked ICs is designed based on the IEEE 1500 standard.

Currently, the design for testability of 2.5D and 3D chips is mainly based on testability circuits designed in accordance with the IEEE 1149.1, IEEE 1500 and IEEE1687 standards, and such standards are mainly aimed at the test on a System On Chip (SOC), with poor expandability and universality, and thus, the circuits cannot be completely applicable to the test of heterogeneous chips under advanced packaging.

SUMMARY

In order to solve the above technical problems, the present disclosure provides a flexible configurable module (FCM) based chiplet test circuit. By configuring the FCMs which are of a two-way skew-symmetric design structure, test configuration steps are simplified, the problems of poor versatility and scalability of the current design for chiplet testability can be solved, and the flexibility and controllability of testing are improved.

The present disclosure provides a FCM based chiplet test circuit, wherein the test circuit is located at an interposer, and the test circuit includes a plurality of FCMs, a control signal configuration module and a test state control module;
  a plurality of mini-chips to be tested are provided in a chiplet, and some test signals of the mini-chips to be tested are respectively connected to upper ports of corresponding FCMs; and some test signals of an outer layer of the chiplet are connected to lower ports of corresponding FCMs; and the test state control module is connected to the control signal configuration module, and sends test control signals to implement the configuration of the control signals in the control signal configuration module and then control the data transmission directions of the FCMs and the switch on or switch off of the FCMs, so that the mini-chips to be tested enter different test modes.

Further, the number of the FCMs of the interposer circuit is 4N, where N is the number of the mini-chips to be tested in the chiplet, and N is a positive integer;
  test data in tdi, test clock tck, scan out so and scan in si signals of each mini-chip to be tested are respectively connected to the upper port of one FCM, and the lower port of the FCM connected to the tck signal is directly connected to a TCK port at the outer layer of the chiplet; the lower port of the FCM connected to the tdi signal of the first mini-chip to be tested is connected to a TDI port at the outer layer of the chiplet; the lower ports of the FCMs connected to the tdi signals of the other mini-chips to be tested are connected to an output end of a 1-of-2 multiplexer of the previous-stage mini-chip to be tested; an output of the next-stage mini-chip to be tested tdo is connected to an input end of a current-stage 1-of-2 multiplexer, the other input port of the current-stage multiplexer is connected to an output port of the previous-stage 1-of-2 multiplexer, a control signal of the current-stage 1-of-2 multiplexer is connected to an output end of a current-stage inverter, an output end of a last-stage multiplexer is connected to an input port of a 1-of-3 multiplexer 3Mux, and an output end of the 1-of-3 multiplexer is connected to a TDO signal of the outer layer of the chip; the lower port of the FCM connected to the si signal of the last mini-chip to be tested is connected to a SI signal of the outer layer of the chiplet; the lower port of the FCM connected to the so signal of the last mini-chip to be tested is connected to a SO signal of the outer layer of the chiplet; the input ports and output ports in the horizontal direction of two adjacent FCMs connected to the so and si signals of the mini-chip to be tested are interconnected; and tms, trst and se signals of all the mini-chips to be tested are directly connected to TMS, TRST and SE signals of the outer layer of the chiplet.

Further, an input end of the control signal configuration module is connected to a TDI signal of the outermost layer of the chiplet, and an output port of the control signal configuration module is connected to an input port of the 1-of-3 multiplexer 3Mux; and the control signal configuration module contains a plurality of output control signals, all the control signals are respectively connected to the control signal of each FCM and input ports of all the inverters, and shift and update enable signals inside the control signal configuration module are connected to the test state control module.

Further, an input end of the test state control module is connected to the TDI, TRST, TMS and TCK signals of the outer layer of the chiplet, and an output end thereof is connected to an input port of the 1-of-3 multiplexer 3Mux; and the test state control module is connected to the control signal configuration module, and sends control signals to implement the shift and update operations of data in the control signal configuration module to complete the configuration of the control signals, and then control the data transmission directions of the FCMs and the switch on or switch off of the FCMs.

Further, the outside of the FCM is provided with six ports, i.e., FCM_Top_Y, FCM_Bottom_Y, FCM_To_Right, FCM_From_Left, FCM_From_Right and FCM_To_Left ports; where the FCM_Top_Y and FCM_Bottom_Y ports at the upper and lower ends of the FCM are bidirectional transmission ports; the FCM_From_Left and FCM_From_Right ports are input ports; and the FCM_To_Right and FCM_To_Left ports are output ports;

the FCM is of a two-way skew-symmetric structure, an axis of symmetry of the FCM is a connecting line of the FCM_To_Right and FCM_To_Left ports, and when a horizontal bidirectional transmission mode is adopted, the control signal of the upper left part of the FCM is exactly the same as the control signal of the lower right part;

the upper left part of the FCM includes a tri-state gate Tri1, a tri-state gate Tri2, a register A, a latch C, a multiplexer Fmux1, a multiplexer Fmux2, a multiplexer Fmux3 and a multiplexer Fmux4; where the multiplexer Fmux1, the register A, the multiplexer Fmux2, the latch C, the multiplexer Fmux3 and the multiplexer Fmux4 are connected in series from left to right, that is, the output of the previous stage is connected to the input end of the next stage;

one input end of the multiplexer Fmux1 is connected to the FCM_From_Left port; an output of the multiplexer Fmux4 is connected to the FCM_To_Right port; an output end of the tri-state gate Tri1 is connected to the FCM_Top_Y port of the FCM, and the output end of the multiplexer Fmux3 is connected to the input end of the tri-state gate Tri1; and an input end of the tri-state gate Tri2 is connected to the FCM_Top_Y port of the FCM, and an output end thereof is connected to an input end of the multiplexer Fmux4;

the lower right part of the FCM includes a tri-state gate Tri3, a tri-state gate Tri4, a register B, a latch D, a multiplexer Fmux5, a multiplexer Fmux6, a multiplexer Fmux7 and a multiplexer Fmux8; where the multiplexer Fmux8, the latch D, the multiplexer Fmux7, the register B, the multiplexer Fmux6 and the multiplexer Fmux5 are connected in series from right to left, that is, the output of the previous stage is connected to the input end of the next stage;

all of the multiplexer Fmux1, the multiplexer Fmux2, the multiplexer Fmux3, the multiplexer Fmux4, the multiplexer Fmux5, the multiplexer Fmux6, the multiplexer Fmux7 and the multiplexer Fmux8 are 1-of-2 multiplexers; and one input end of the multiplexer Fmux8 is connected to the lower port FCM_From_Right of the FCM, and the other input port is connected to an output port of the multiplexer Fmux4; an output port of the multiplexer Fmux5 is respectively connected to the FCM_To_Left port and the other input port of the multiplexer Fmux1; an input end of the tri-state gate Tri3 is connected to the lower port FCM_Bottom_Y of the FCM, and an output end thereof is connected to an input port of the multiplexer Fmux5; and an output end of the tri-state gate Tri4 is connected to the lower port FCM_Bottom_Y of the FCM, and an input end thereof is connected to an output end of the multiplexer Fmux6.

Further, the FCM has 12 control signals, where FCM_Top_En1, FCM_Top_En2, FCM_Bottom_En1 and FCM_Bottom_En2 are respectively the control signals of the tri-state gate Tri1, the tri-state gate Tri2, the tri-state gate Tri3 and the tri-state gate Tri4 to realize the bidirectional transmission of the FCM_Bottom_Y and FCM_Top_Y ports in the vertical direction of the FCM; From_Left_En1, FCM_Left_En2, To_Right_En2, To_Right_En1, To_Left_En2, To_Left_En1, From_Right_En2 and From_Right_En1 are respectively the control signals of the multiplexer Fmux1, the multiplexer Fmux2, the multiplexer Fmux3, the multiplexer Fmux4, the multiplexer Fmux5, the multiplexer Fmux6, the multiplexer Fmux7 and the multiplexer Fmux8; and by controlling control end signals of each multiplexer and tri-state gate, the switching of different modes and test lines of the FCM is realized.

Further, the FCM internally includes a plurality of transmission lines, and according to the selection of the transmission lines, a register and latch excluded mode and a register and latch included mode are included; the register and latch excluded mode represents that all the transmission lines inside the FCM are configured be in the excluded mode; and the register and latch included mode has two configurations, one configuration is that some transmission lines are configured to be in the register and latch included mode, and the remaining transmission lines are configured be in the register and latch excluded mode, and the other configuration is that all the transmission lines are configured to be in the register and latch included mode.

Further, the control signal configuration module includes a self-locking module 1, a signal configuration module and a self-locking module 2 connected in series in sequence, where the self-locking module 1 is located at the initial input end of the control signal configuration module, and the self-locking module 2 is located at the tail end of the control signal configuration module;

the signal configuration module is formed by connecting a plurality of test data register units in series, the number of output signals is determined based on the actual configured number of signals, and all the control signals are respectively connected to the control signal ends of corresponding FCMs; and both the self-locking module 1 and the self-locking module 2 are 1-bit test data register units, and the self-locking module 1 and the self-locking module 2 control the shift and update operations of data in the signal configuration module.

Further, the test state control module includes an 8-bit test control finite state machine TC_FSM and an instruction register module;

the test control finite state machine TC_FSM includes five ports, i.e., TMS, TCK, TRST, TDI and TDO ports, receives signals of the TMS and TCK ports to produce decodes, and generates a test control sequence to control the shift-in, shift-out and update operations of data in the instruction register and the control signal configuration module;

an input of the instruction register module is connected to a TDI port at the outer layer of the chiplet, an output thereof is connected to an input end of the 1-of-3 multiplexer 3Mux, and the instruction register module stores chiplet test instructions and outputs the control signal of 3Mux.

Further, the test control finite state machine TC_FSM has eight transition states, i.e., Test_rest, Test hangs, drSel, irSel, shift_dr, update_dr, shift_ir and update_ir states; all state transitions are based on a value of TMS at the rising edge of TCK, and all test logic changes of the circuit are performed at the rising or falling edge of TCK.

Further, the test from the circuit includes the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

The beneficial effects of the present disclosure are as follows: the present disclosure puts forward a flexible configurable module which adopts a two-way skew-symmetric design structure, and can achieve a horizontal dual-line transmission mode and a vertical bidirectional transmission mode by configuring, the transmission lines being independent of each other without interference, thereby meeting the requirements of horizontal dual-line transmission scenarios; and a FCM based chiplet test circuit meets the requirements of horizontal dual-line testing and the plug-and-play strategy, enhances the flexibility and controllability of testing, and provides a universal and scalable test access structure for design for testability of chiplets;

a control signal configuration module is designed in the test circuit of the present disclosure, the module adopts a self-locking module design, and after a control signal is configured, a self-locking module can complete by itself the control of shift and update enable signals of the module. Compared with conventional designs, an additional control signal overhead is reduced, and the design complexity is simplified.

An 8-bit finite state machine is also designed in the test circuit of the present disclosure, through which the configuration of FCM signals can be completed. Compared with a traditional 16-bit finite state machine based on a TAP controller, control signal configuration steps can be effectively reduced, thereby improving the test efficiency.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 7 is a configuration information diagram of a register and latch excluded mode of the FCM based chiplet test circuit according to embodiments of the present disclosure;

FIG. 10(a) is a simulation diagram of a scan test on chip1 before integration in a chiplet of the FCM based chiplet test circuit according to embodiments of the present disclosure;

FIG. 10(b) is a simulation diagram of a scan test on chip1 after integration in the chiplet of the FCM based chiplet test circuit according to embodiments of the present disclosure;

DESCRIPTION OF THE EMBODIMENTS

In order to make the content of the present disclosure more clearly understood, the present disclosure will be further described in detail below based on the specific embodiments and with reference to the accompanying drawings.

Figure 12:
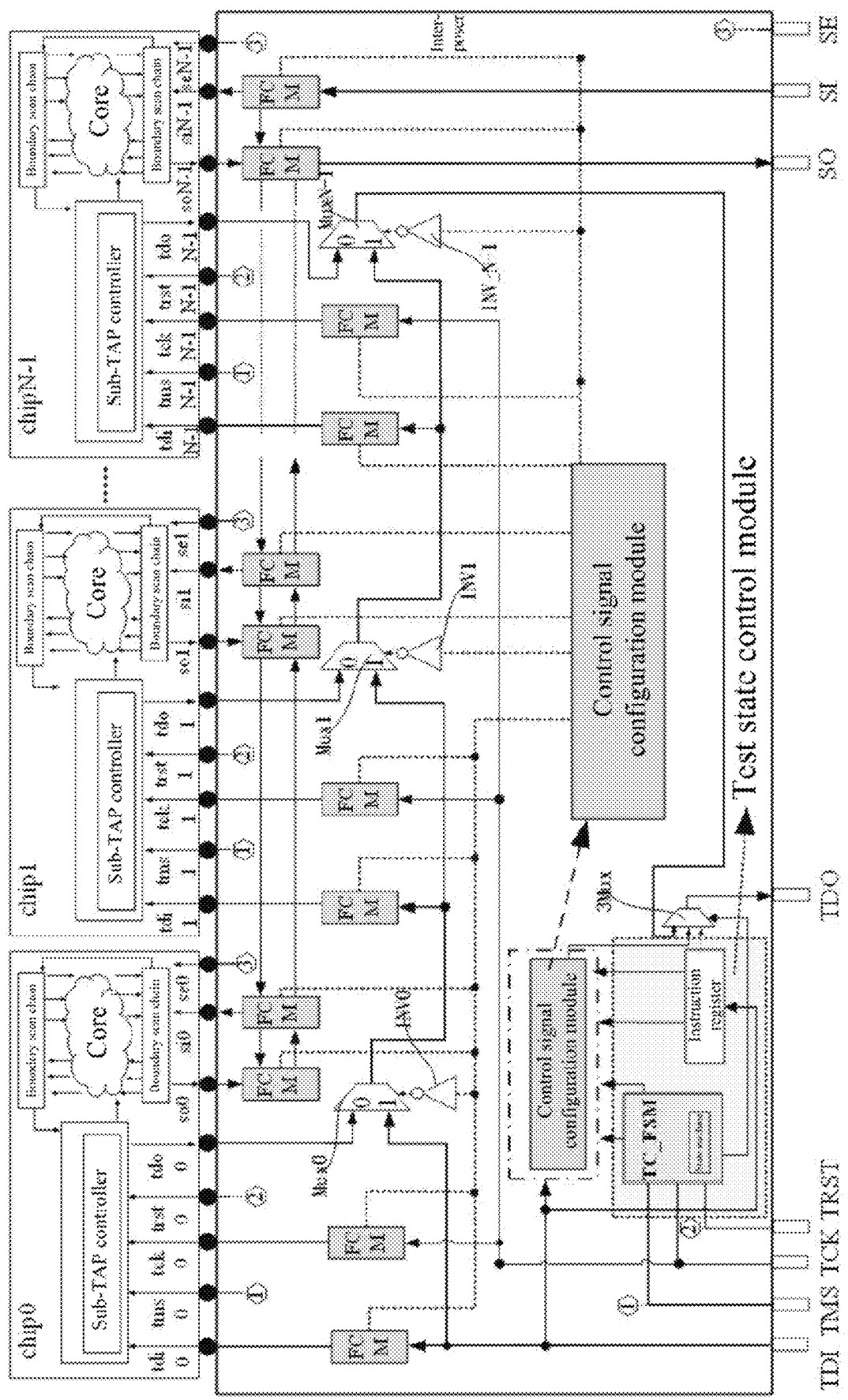
FIG. 12 is an overall schematic structural diagram of the chiplet test circuit according to the present disclosure.

The overall structure of a ICM based chiplet test circuit provided by the present disclosure is shown in FIG. 12, the test circuit is located at an interposer, and the interposer circuit controls the input and output of all mini-chip test signals; the test circuit includes 4N FCMs (N is the number of mini-chips under test in a chiplet, and N is a positive integer), a control signal configuration module, a test state control module, N 1-of-2 multiplexers (Mux0, Mux1 . . . MuxN−1), one 1-of-3 multiplexer 3Mux, and N inverters (INV0, INV1 . . . INVN−1); and mini-chips chip0, chip1 . . . chipN−1 in the test circuit are arranged in order from left to right on the interposer, chip0 is at the first position, and chipN−1 is at the end position.

Embodiment 1

Figure 1:
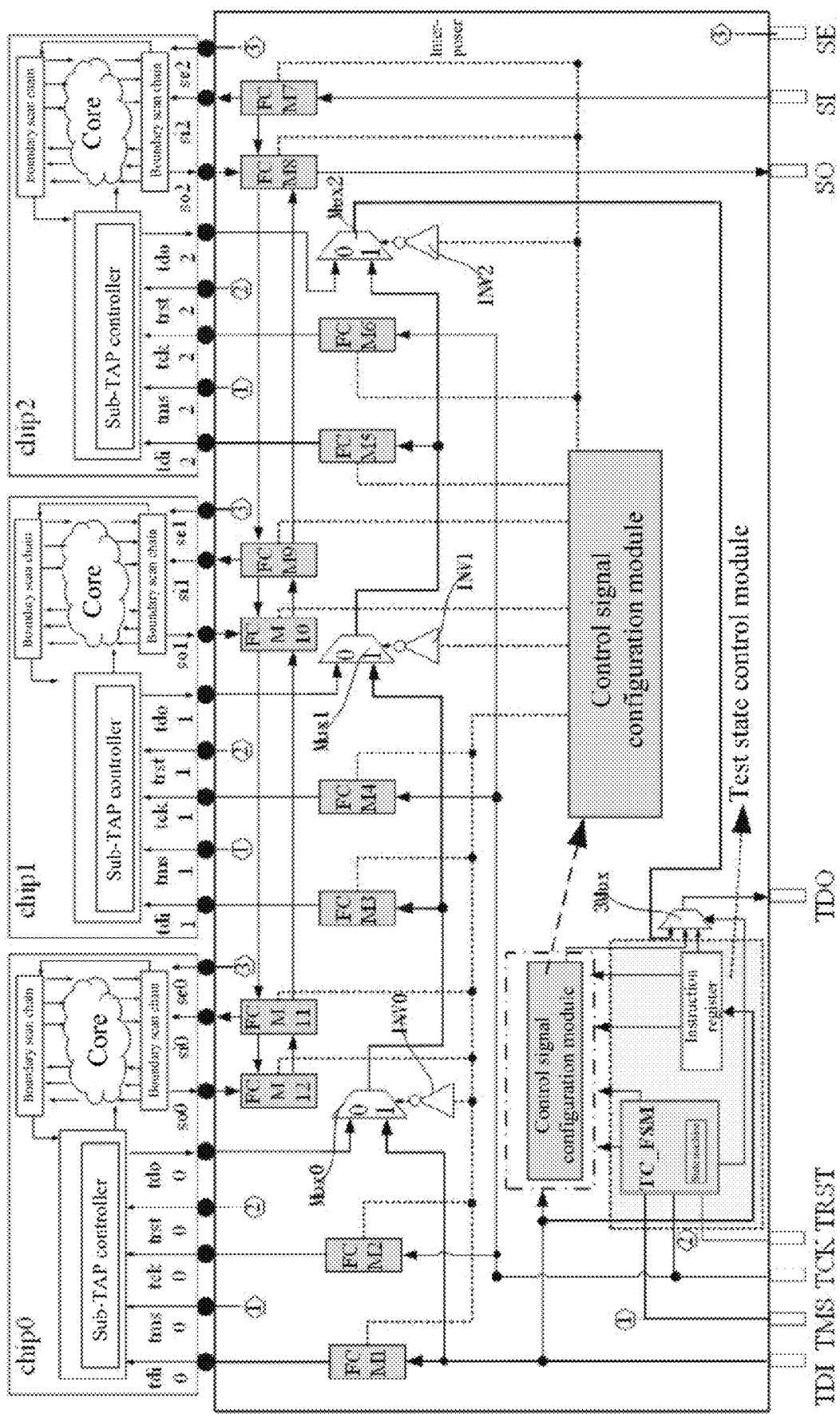
FIG. 1 is a schematic structural diagram of the chiplet test circuit according to embodiments of the present disclosure.

Based on the overall structure shown in FIG. 12, an application case of the present disclosure is shown in FIG. 1, in which the chiplet includes three mini-chips under test, chip0, chip1 and chip2. The focus of the design of the present disclosure lies in the interposer located below the mini-chips, the interposer circuit includes 12 FCIMs (i.e., FCM1-FCM12), a control signal configuration module, a test state control module, three 1-of-2 multiplexers (i.e., Mux0, Mux1, Mux2), one 1-of-3 multiplexer Mux3, and three inverters (i.e., INV0, INV1, INV2).

In the structure, the upper ports FCM_Top_Y of FCM1, FCM3 and FCM5 are respectively connected to the test data in tdi signals of chip0, chip1 and chip2, and the lower ports FCM_Bottom_Y are connected to the TDI signals below the interposer. The upper ports CM_Top_Y of FCM3, FCM4 and FCM6 are respectively connected to test clock tck signals of chip0, chip1 and chip2, and the lower ports FCM_Bottom_Y are respectively connected to the TCK signals below the interposer. This structure utilizes the bidirectional transmission characteristic of FCM in the vertical direction.

The scan in si ports of chip0, chip1 and chip2 are respectively connected to the upper ports FCM_Top_Y of FCM7. FCM9 and FCM11, the scan out so ports are respectively connected to the upper ports FCM_Top_Y of FCM8. FCM10 and FCM12, and the in and out ports in the horizontal direction of two adjacent FCMs are connected to each other, that is, the FCM_To_Right port is connected to the FCM_From_Left port of the adjacent FCM, and the FCM_From_Right port is connected to the FCM_To_Left port of the adjacent FCM. Here, the lower ports FCM_Bottom_Y of FCM7 and FCM8 are respectively connected to SI and SO signals. The scan design structure makes full use of the horizontal two-way transmission characteristic of FCMs, and can transmit scan test data from right to left and transmit scan out data from left to right at the same time.

In FIG. 1, the scan test input data of chip2 is transmitted from the lower port FCM_Bottom_Y of FCM7 to the upper port. CM_Top_Y of FCM7 and then enters the scan in port of chip2, and the scan test output data is transmitted from the upper port FCA_Top_Y of FCM8 to the lower port FCM_Bottom_Y of FCM8 and then output from SO below the interposer. The scan out data of chip0 and chip1 streams in from the upper ports FCM_Top_Y of FCM12 and FCM10 respectively and streams out from the output port FCM_To_Left in the horizontal direction. The vertical bidirectional transmission characteristic of the FCM is utilized herein, and thus, the FCM can be configured to transmit data either upward or downward.

In the structure, the tms, trst and se signals of chip0, chip1 and chip2 are respectively connected to the TMS, TRST and SE signals below the interposer. In this design, the tins, trst and se signals of the mini-chips under test are not controlled, and the three signals can be directly connected to external TMS, TRST and SE signals.

The scan structure utilizes the horizontal two-way transmission characteristic of the FCM, and can transmit scan in and out data at the same moment, and thus, by controlling the FCM, the reuse of scan chain ports is realized, thereby reducing the overhead of test ports.

In the structure, the design of the control signal configuration module is based on the board-level test standard IEEE 1149.1, and controlled by a TAP (test access port) controller in a TAG; and the control signal configuration module is connected to the control signals of all the FCMs, so as to control the data transmission directions as well as switch on and switch off states of all the FCMs.

After the power-on reset of the control signal configuration module, default outputs are all 0, and all the FCMs in the non-test state are kept in a switch off state; where in a test mode, in a FCM1 and FCM2 group, a FCM3 and FCM4 group, and a FCM5 and FCM6 group, the configuration signals of the FCMs are identical, so the configuration signals of each group are the same. Such a design can effectively reduce configuration steps and avoid errors caused by too many configuration signals.

In the structure, the control signal ends of the multiplexers Mux0, Mux1, and Mux2 are respectively connected to the output ends of the inverters INV0, INV1, and INV2, and the input ends of the inverters are connected to the control signal configuration module. When chip0 is tested, it is required to configure a 1 signal to the input end of the inverter below chip0, which becomes 0 after inversion, at this time, tdo0 of chip0 is selected as the output; and when the input ends of the inverters of chip1 and chip2 are in an untested state, the default value of the output of the control signal configuration module is 0, at this time, the outputs of chip1 and chip2 are bypassed, which can realize an independent test on chip0. The same method can realize the test on chip1 and chip2.

In the structure, the input of the multiplexer Mux3 is respectively connected to the output of the control signal configuration module, the output of the instruction register and the output of the multiplexer Mux2, and the control signal of the multiplexer Mux3 is connected to the instruction register. When mini-chips are tested, the output value of Mux3 is the output value of Mux2.

In the structure, a core module in the test state control module is an 8-bit test control finite state machine, which is designed based on a JTAG port, and generates a test control sequence based on the state transitions of TMS and TCK to realize the shift and update operations of the internal instruction registers, the control signal configuration module as well as the registers and latches in the FCMs.

Figure 2:
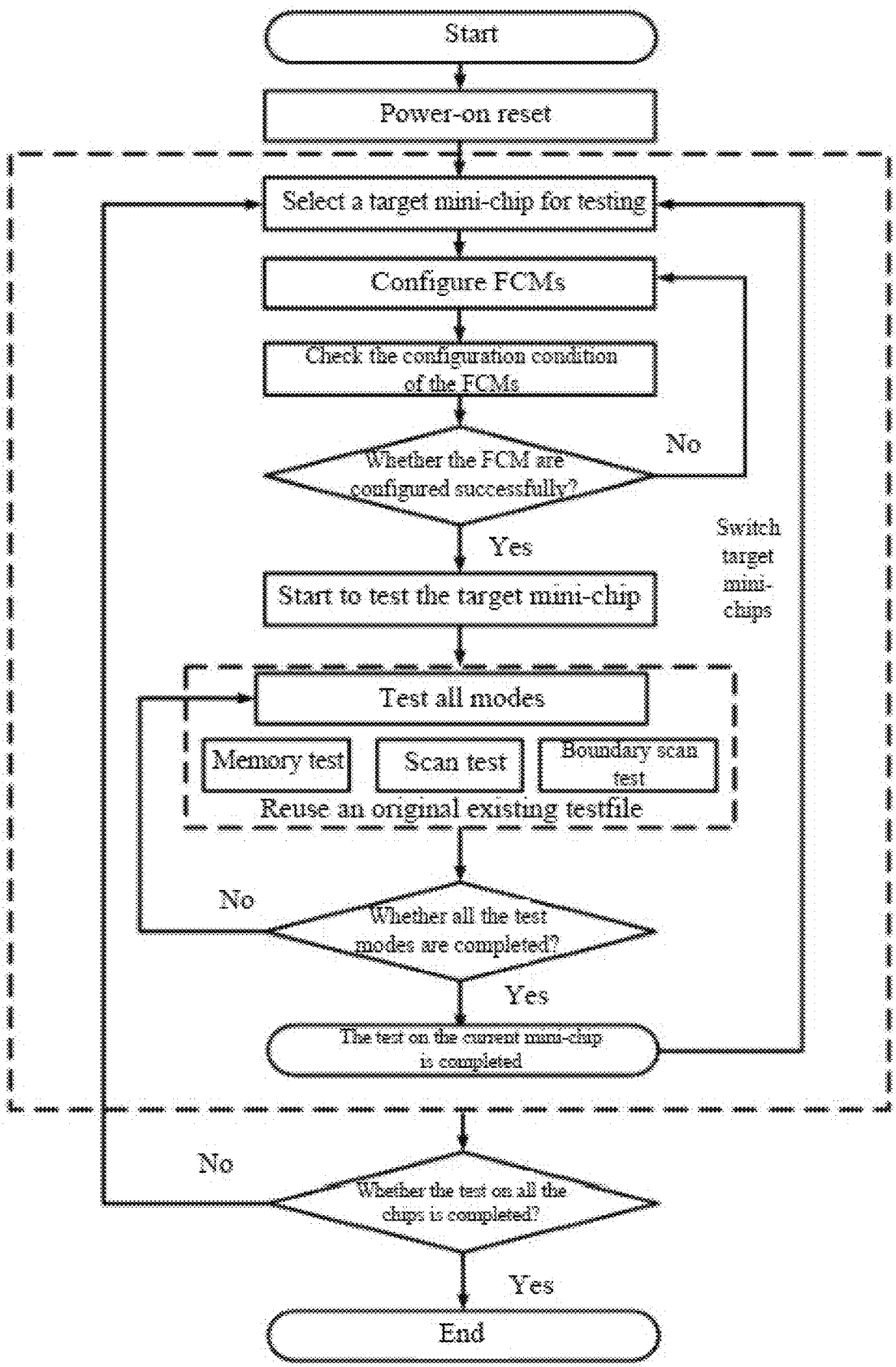
FIG. 2 is a flowchart of a test method of the chiplet test circuit according to the present disclosure.

FIG. 2 is a test flow of the chiplet test circuit provided by the present disclosure, and the basic test principle of the chiplet test circuit is to input configuration signals through a test port below the interposer to configure FCMs, and respectively control the switch on and switch off of tdi, tck, tdo, si and so signals of chip0, chip1 and chip2, so as to achieve the purpose of testing the chiplet.

The basic test flow refers to FIG. 2, and includes the following specific steps: step 1, carrying out power-on reset; step 2, selecting a target mini-chip for testing; step 3, configuring FCMs; step 4, checking the configuration condition of the FCMs; step 5, determining whether the FCMs are configured successfully; if not, returning to the previous step to reconfigure, and if so, proceeding to the next step; step 6, starting to test the target mini-chip; step 7, testing all modes of the target mini-chip, where the test modes include a memory test, a scan test and a boundary scan test; step 8, determining whether all the test modes of the current mini-chip are completed, if not, returning to step 7 to select untested modes, and proceeding to the next step after all the test modes are completed; step 9, after the test on the current mini-chip is completed, the switching of the target mini-chips is performed, and repeating the above test steps; and step 10, determining whether the test on all the mini-chips is completed, if so, ending the test, and if not, returning to step 2 to select untested chips and testing the untested chips in accordance with the above steps until the test on all the chips is completed.

The FCM based chiplet test circuit provided by the present disclosure can meet that: 1) the scalability is strong, the original DFT logics of chips are reconstructed and reused, and the plug-and-play strategy is met; 2) the test power consumption is low, and when a single chip is tested, the other chips are kept in an off state and do not interfere with each other; 3) the test is flexible and controllable, and the test state can be switched flexibly as needed; and 4) the FCM based scan design can effectively reduce configuration steps and wires, thereby simplifying the design complexity.

Embodiment 2

Figure 3:
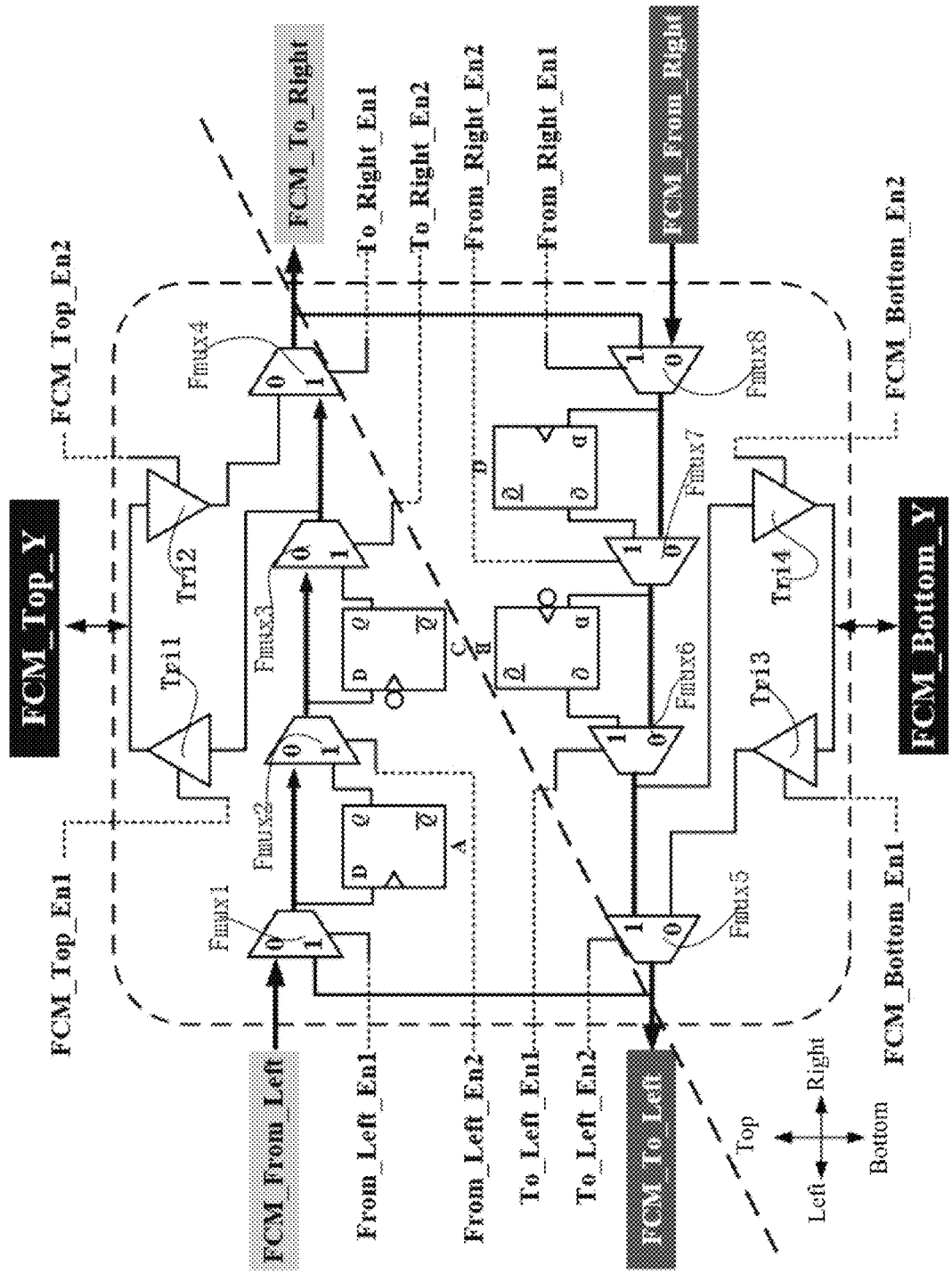
FIG. 3 is a detailed schematic structural diagram of the flexible configurable module according to the present disclosure.

For facilitating the understanding of the present disclosure, the structures and functions of internal modules of this patent will be introduced in detail in this embodiment:
(1) Flexible Configurable Module The structure of the flexible configurable module is shown in FIG. 3. The flexible configurable module has a high-bandwidth data transmission characteristic and flexible configurability, and can transmit any test signal, control signal or clock signal.

The feature of the flexible configurable module FCM is that a two-way skew-symmetric design structure is adopted, so that bidirectional data transmission from left to right and right to left in the horizontal direction at the same time can be realized, and the respective transmission paths are free from interference; and in the vertical direction, the bidirectional transmission function from bottom to top and top to bottom can be realized.

The outside of the FCM is provided with six ports, i.e., FCM_Top_Y, FCM_Bottom_Y, FCM_To_Right, FCM_From_Left, FCM_From_Right and FCM_To_Left ports. The FCM_Top_Y and FCM_Bottom_Y ports are bidirectional transmission ports, which can be configured to transmit data from the FCM_Bottom_Y port to the FCM_Top_Y port in the vertical direction, or can be configured to transmit data from the FCM_Top_Y port to the FCM_Bottom_Y port. The FCM_From_Left and FCM_From_Right ports are input ports, the FCM_To_Right and FCM_To_Left are output ports, and the line where the FCM_From_Left and FCM_To_Right ports are located and the line where the FCM_From_Right and FCM_To_Left are located are parallel to each other, and thus, through configuration, bidirectional data transmission at the same moment can be realized.

The flexible configurable module internally includes a register A, a register D, a latch B, a latch C, eight 1-of-2 multiplexers (Fmux1-Fmux8) and four tri-state gates (Tri1-Tri4).

The input end of the multiplexer Fmux1 is respectively connected to the FCM_From_left port and the output of the multiplexer Fmux5. From_Left_En1 is the control signal of the multiplexer Fmux1. When FCM_From_En1 is 1, the output of the multiplexer Fmux1 is an output value of the multiplexer Fmux5, and when FCM_From__En1 is 0, the output of the multiplexer Fmux1 is a value of FCM_From_Left. The output of the multiplexer Fmux1 is respectively connected to the D input end of the register A and an input end of the multiplexer Fmux2.

The other input end of the multiplexer Fmux2 is the output end Q of the register A, the control signal of the multiplexer Fmux2 is From_Left_En2, when From_Left_En2 is 1, the output of the multiplexer Fmux2 is a value of the Q end of the register A, and when From_Left_En2 is 0, the output value of the multiplexer Fmux2 is an output value of the multiplexer Fmux1. The output end of the multiplexer Fmux2 is connected to the input end D of the latch C and an input end of the multiplexer Fmux3 respectively.

The other input end of the multiplexer Fmux3 is the output end of the multiplexer Fmux2, the control signal of the multiplexer Fmux3 is To_Right_En2, when To_Right_En2 is 1, the output of the multiplexer Fmux3 is a value of the output end Q of the register C, and when To_Right_En2 is 0, the output of the multiplexer Fmux3 is an output value of the multiplexer Fmux2; and the output of the multiplexer Fmux3 is respectively connected to an input end of the multiplexer Fmux4 and the input end of tri-state gate Tri1.

The other input end of the multiplexer Fmux4 is the output of the tri-state gate Tri2, the control signal of the multiplexer Fmux4 is To_Right__En1, when To_Right_En1 is 1, the output value of the multiplexer Fmux4 is an output value of the multiplexer Fmux3, and when To_Right_En1 is 0, the output value of the multiplexer Fmux4 is an output value of the tri-state gate Tri2. The output of the multiplexer Fmux4 is respectively connected to the FCM_To_Right port and an input port of the multiplexer Fmux8.

The other input end of the multiplexer Fmux8 is connected to the FCM_From_Right port, and From Right_En1 is the control signal of the multiplexer Fmux8, when From_Right_En1 is 1, the output value of the multiplexer Fmux8 is an output value of the multiplexer Fmux4, and when From_Right_En1 is 0, the output value of the multiplexer Fmux8 is an input value of FCM_From_Right. The output of the multiplexer Fmux8 is respectively connected to the input end D of the register) and an input end of the multiplexer Fmux7.

The other input end of the multiplexer Fmux7 is connected to the output end Q of the register D, the signal From_Right_En2 is the control signal of the multiplexer Fmux7, when From_Right_En2 is 1, the output value of the multiplexer Fmux7 is a value of the output end Q of the register D, and when From_Right_En2 is 0, the output value of the multiplexer Fmux7 is an output value of the multiplexer Fmux8. The output of the multiplexer Fmux7 is respectively connected to the input end A of the latch B and an input end of the multiplexer Fmux6.

The other input end of the multiplexer Fmux6 is the output end Q of the latch B, the signal To_Left_En1 is the control signal of the multiplexer Fmux6, when To_Left_En1 is 1, the value of the output end of the multiplexer Fmux6 is a value of the output end Q of the latch B, and when To_Left_En1 is 0, the value of the output end of the multiplexer Fmux6 is an output value of the multiplexer Fmux7. The output value of the multiplexer Fmux6 is connected to an input of the multiplexer Fmux5.

The other input end of the multiplexer Fmux5 is connected to the output of the tri-state gate Tri3, the signal To_Left_En2 is the control signal of the multiplexer Fmux5, when To_Left_En2 is 1, the output of the multiplexer Fmux5 is an output value of the multiplexer Fmux6, and when To_Left_En2 is 0, the output of the multiplexer Fmux5 is an output value of the tri-state gate Tri3. The output value of the multiplexer Fmux5 is respectively connected to the FCM_To_Left port and an input of the multiplexer Fmux1.

The input of the tri-state gate Tri1 is connected to the output of the multiplexer Fmux3, and the output thereof is connected to the FCM_Top_Y port; the input of the tri-state gate Tri2 is connected to the port FCM_Top_Y, and the output thereof is connected to an input end of the multiplexer Fmux4; the input of the tri-state gate Tri3 is connected to the FCM_Bottom_Y port, and the output thereof is connected to the 0 signal input end of the multiplexer; and the input end of the tri-state gate Tri4 is connected to the output end of the multiplexer Fmux6, and the output thereof is connected to the FCM_Bottom_Y port.

Figure 4A:
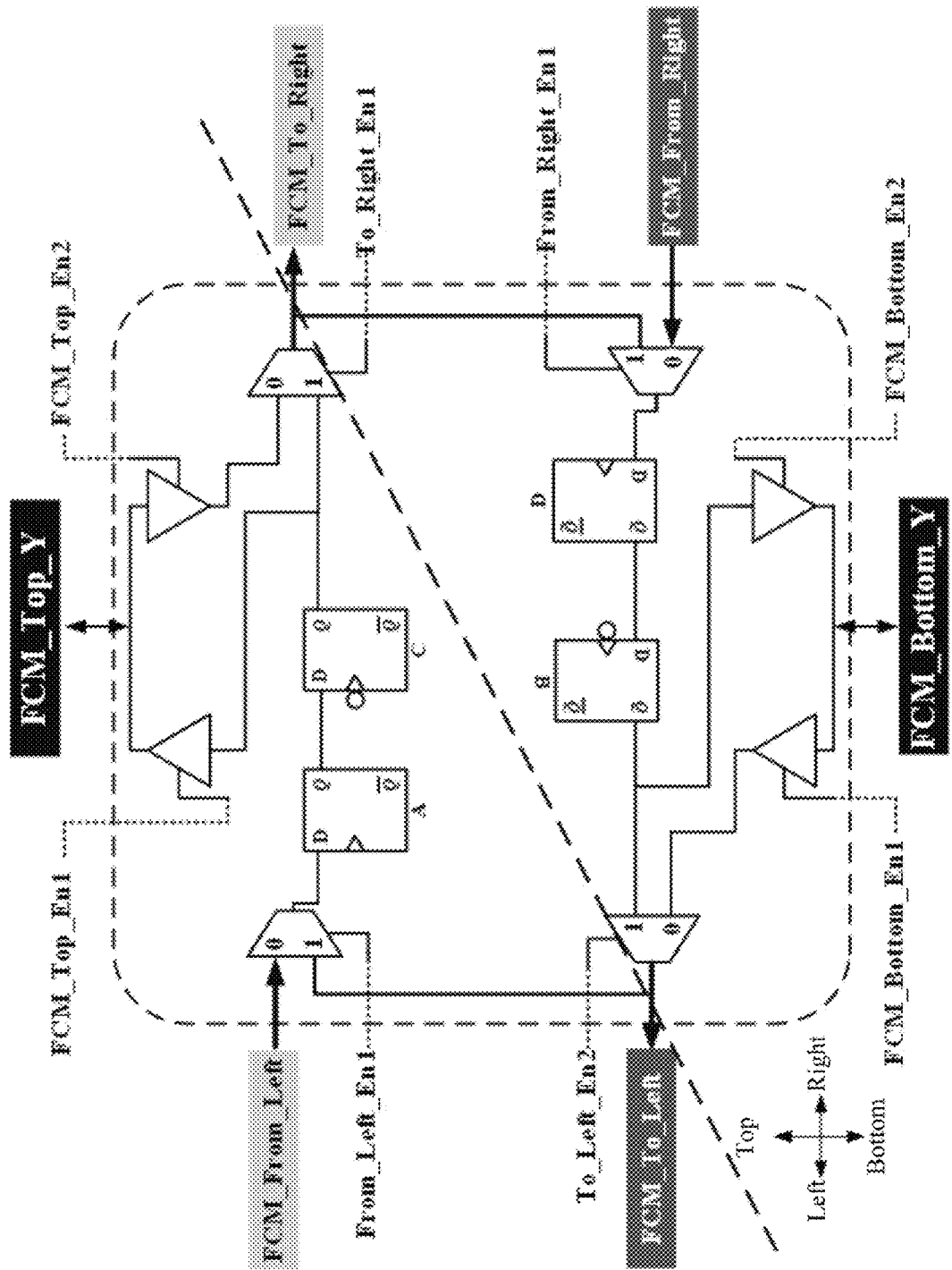
FIG. 4(a) is a schematic structural diagram of the flexible configurable module including registers and latches both on two parallel lines in the horizontal direction according to the present disclosure.
Figure 4B:
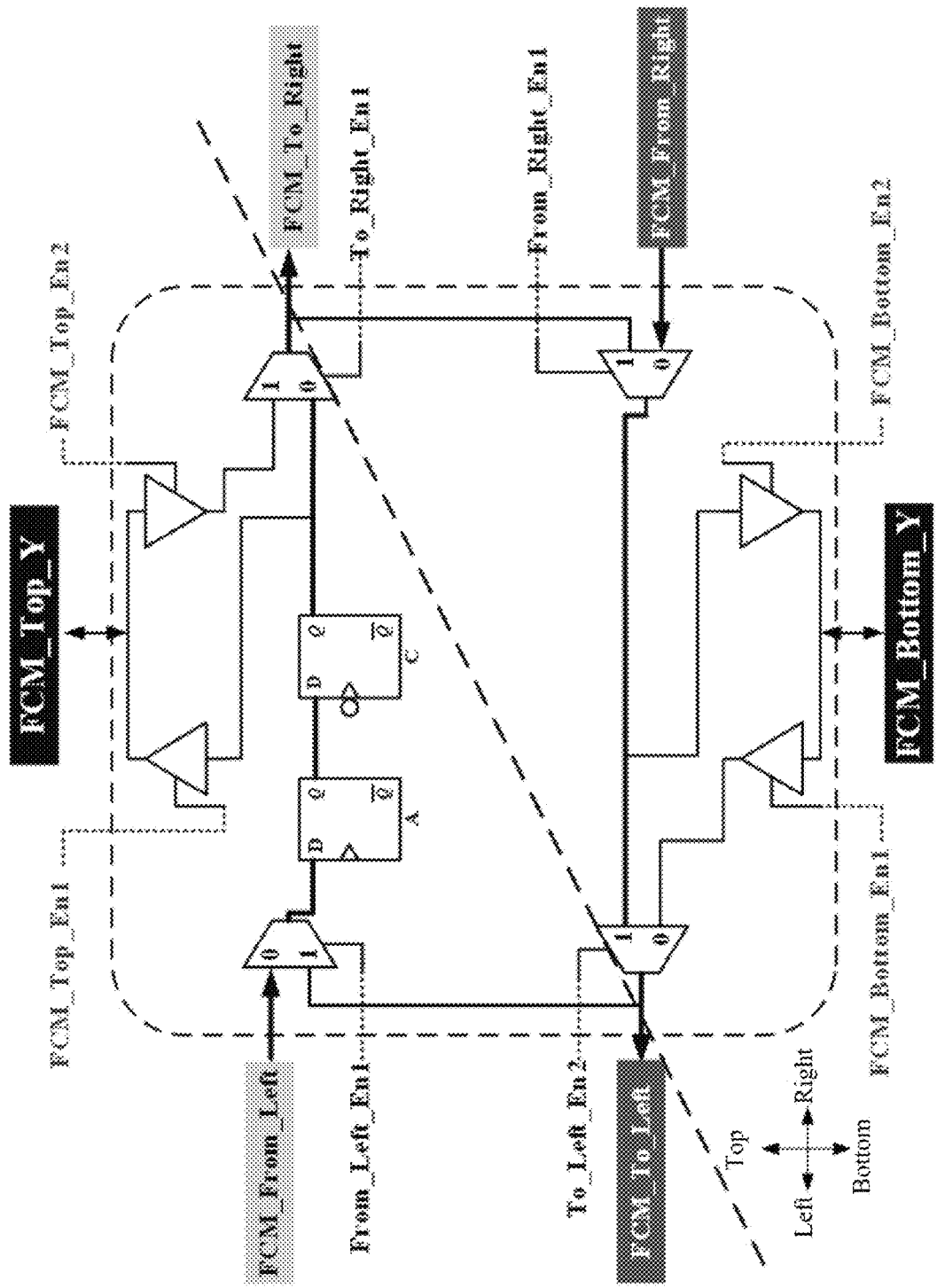
FIG. 4(b) is a simplified schematic structural diagram of the flexible configurable module including registers and latches only on a line where FCM_From_Left to FCM_To_Right are located in the horizontal direction according to the present disclosure.
Figure 4C:
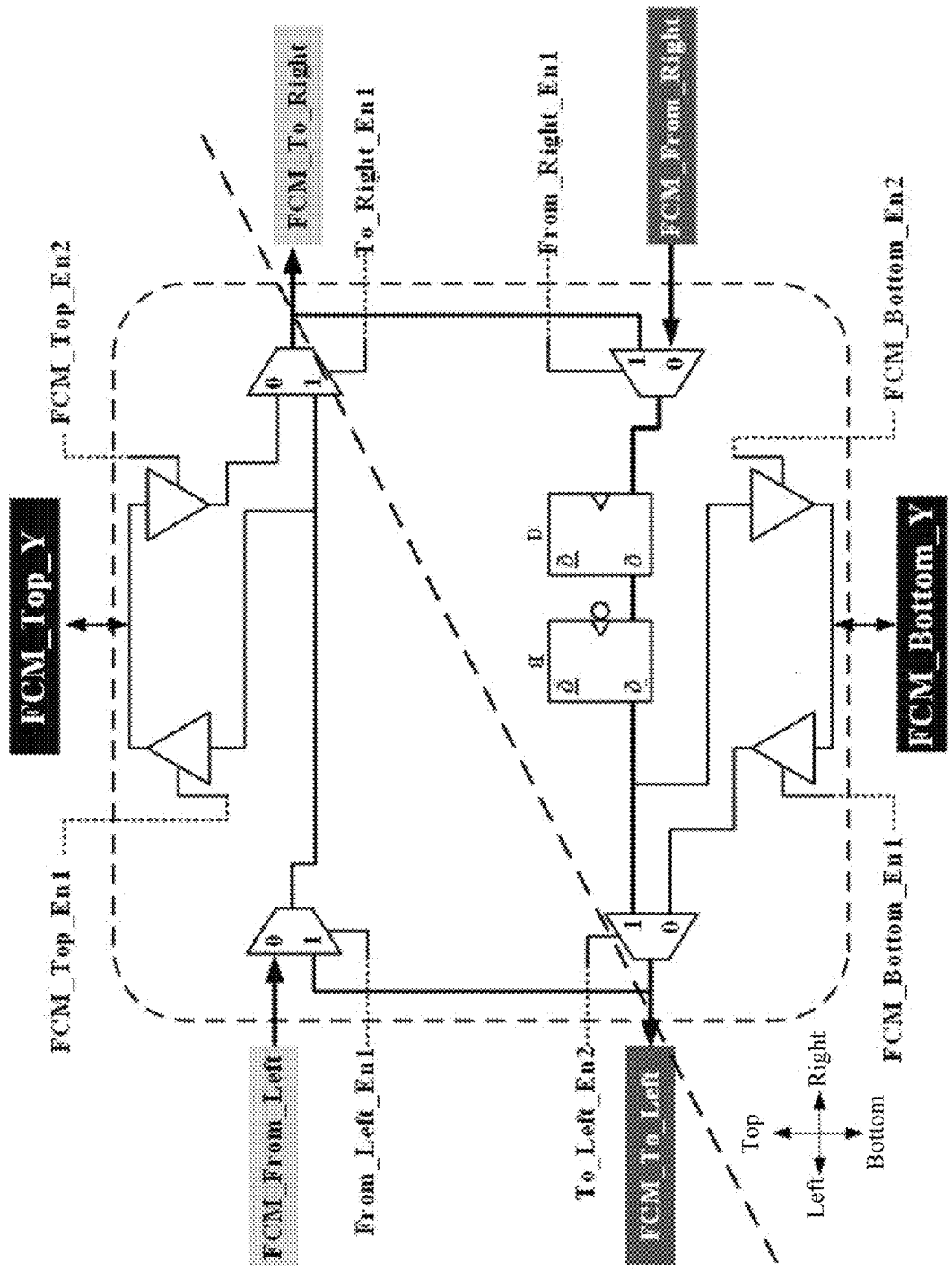
FIG. 4(c) is a simplified schematic structural diagram of the flexible configurable module including registers and latches only on a line where FCM_From_Right to FCM_To_Left are located in the horizontal direction according to the present disclosure.
Figure 4D:
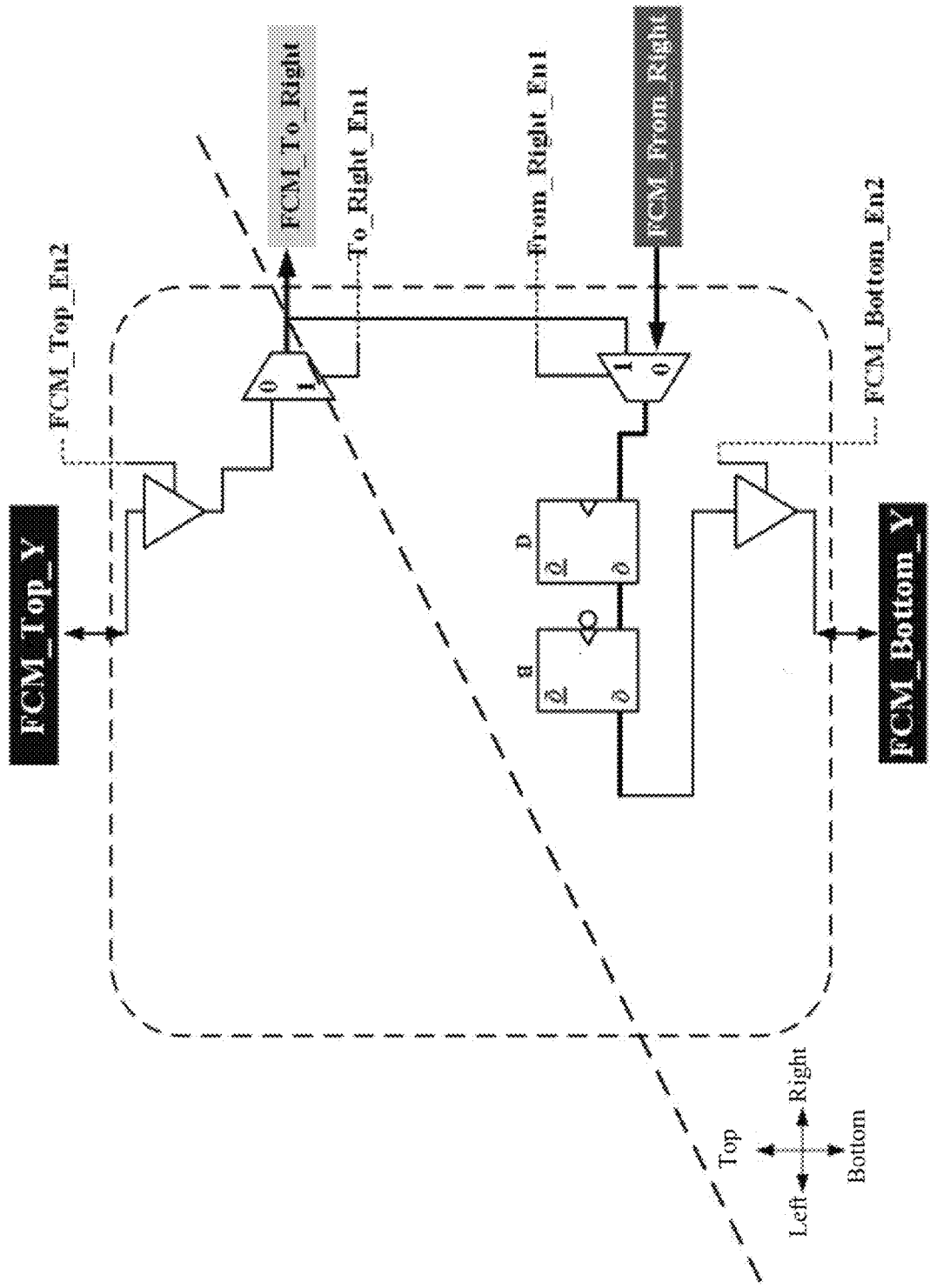
FIG. 4(d) is a simplified schematic structural diagram of the flexible configurable module including registers and latches only on a line where FCM_Top_Y to FCM_Bottom_Y are located in the vertical direction according to the present disclosure.
Figure 4E:
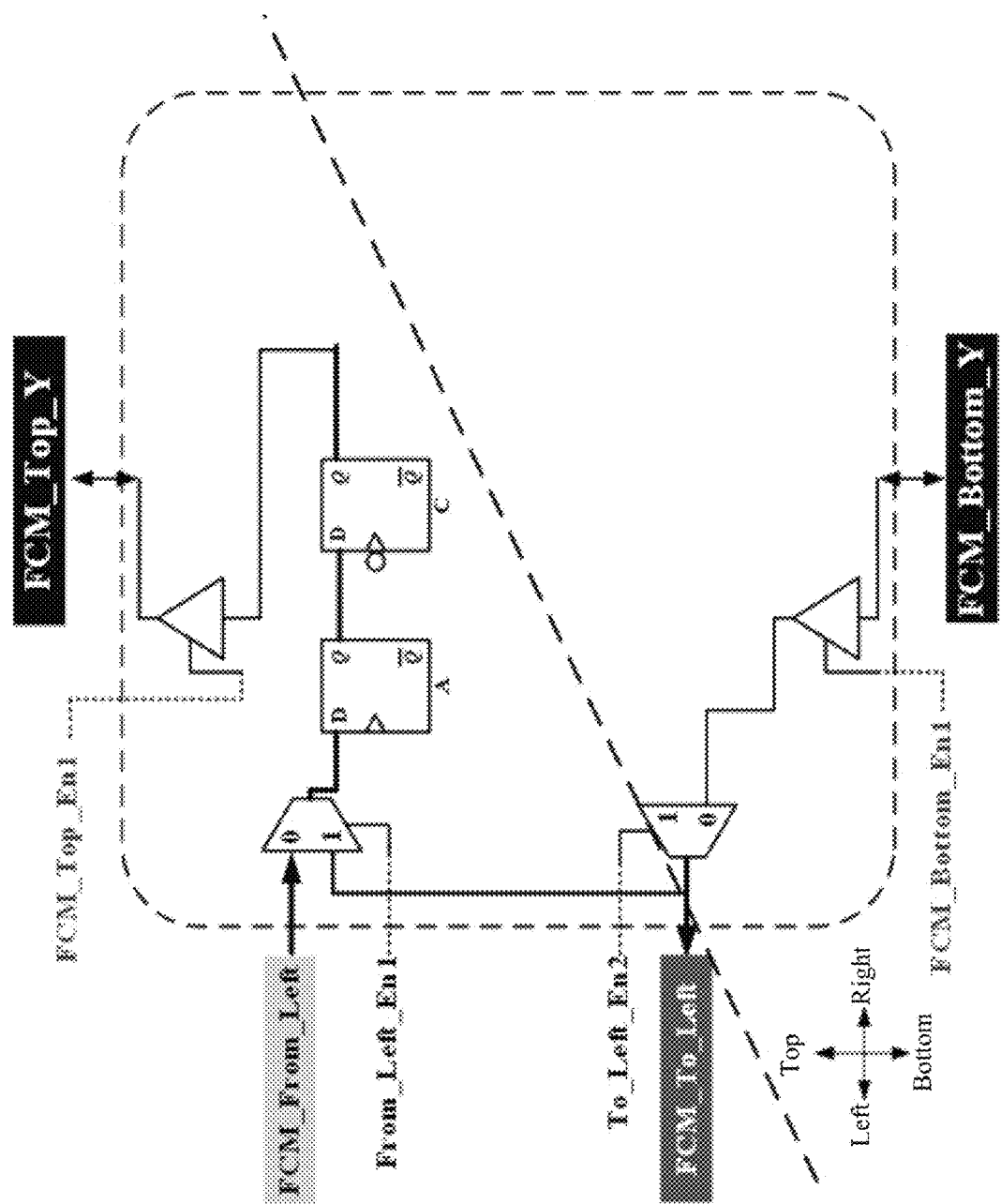
FIG. 4(e) is a simplified schematic structural diagram of the flexible configurable module including registers and latches only on a line where FCM_Bottom_Y to FCM_Top_Y are located in the vertical direction according to the present disclosure.

The FCMs can be configured into two modes, i.e., a register and latch included mode and a register and latch excluded mode. The register and latch included mode of the FCM is shown in FIGS. 4(a)-4(e), in which FIG. 4(a) shows that the paths between FCM_From_Left and FCM_To_Right and between FCM_From_Right and FCM1_To_Left are configured to be in the register and latch included mode; FIG. 4(b) shows that only the path between FCM_From_Left and FCM_To_Right is configured to be in the register and latch included mode; FIG. 4(c) shows that only the path between FCM_From_Right and FCM_To_Left is configured to be in the register and latch included mode; where FIG. 4(b) and FIG. 4(c) shows the unique transmission modes of the FCM, that is, at the same moment, the FCM in the horizontal direction can be configured to be in a horizontally leftward register and latch included mode, while the circuit towards the right does not contain registers and latches; the FCM in FIG. 4(d) is configured such that FCM_Top_Y to FCM_Bottom_Y are switched on downwards, and the path is in the register and latch included mode; and FCM_Bottom_Y to FCM_Top_Y in the FCM in FIG. 4(e) is configured as a transmission path including registers and latches.

Figure 5:
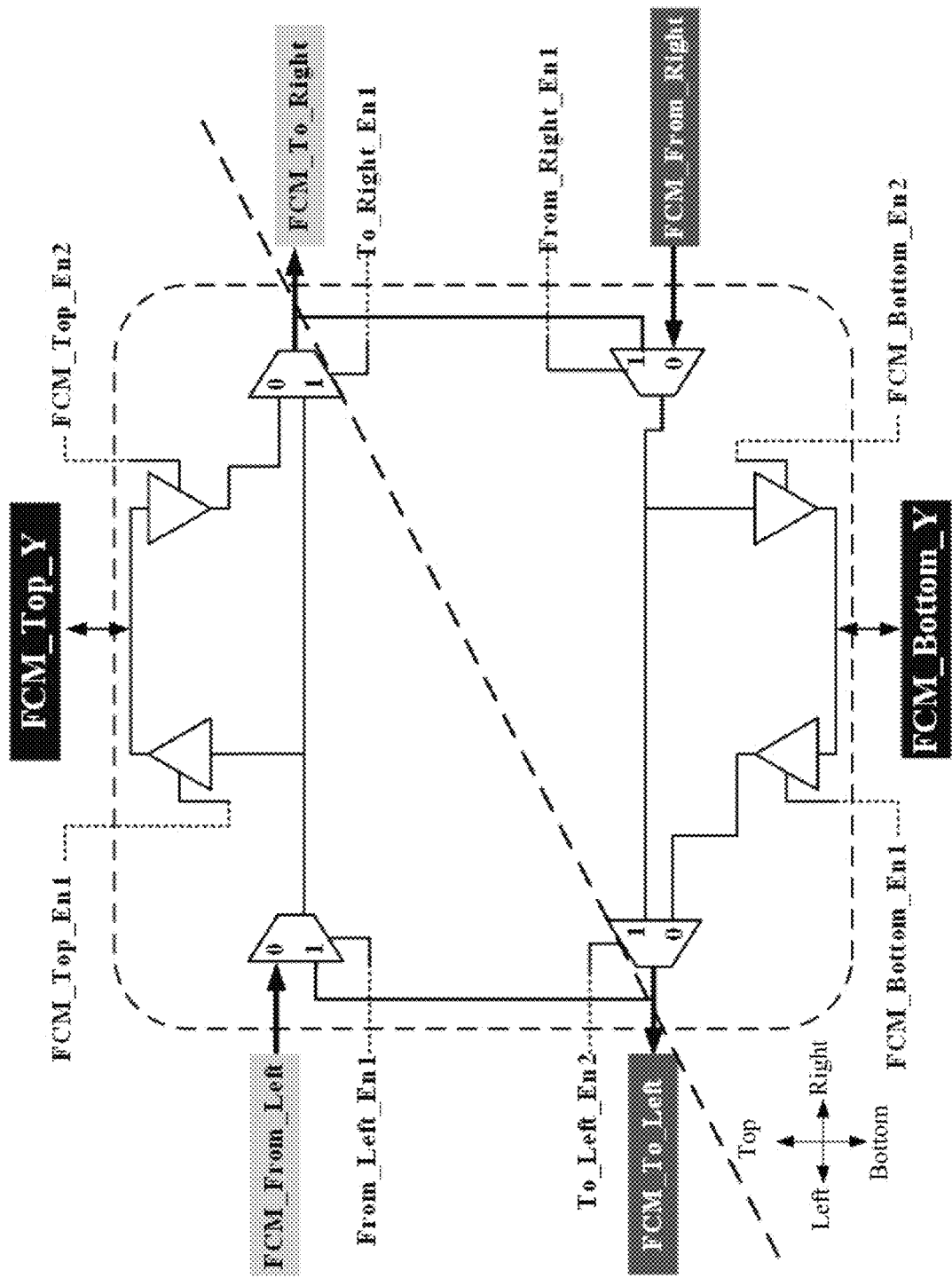
FIG. 5 is a schematic structural diagram of the flexible configurable module excluding registers and latches according to the present disclosure.

The register and latch excluded mode of the FCM is shown in FIG. 5, and in the figure, the paths between FCM_From_Left and FCM_To_Right, between FCM_From_Right and FCM_To_Left, between FCM_Bottom_Y and FCM_Top_Y and between FCM_Top_Y and FCM_Bottom_Y are configured to be in the register and latch excluded mode.

In the two modes, the register and latch included mode can transmit arbitrary test data, the registers can solve the timing limitation problem of outputting long test paths from mini-chips, and the latches can keep the transmitted data output at a low level, thereby reducing the holding time violation. The register and latch excluded mode can transmit arbitrary test signals or clock signals.

The FCM adopts a two-way skew-symmetric structure, so that in a horizontal multi-line transmission scenario, configuration steps can be effectively reduced. In FIG. 3, the tri-state gates, the registers A and B, the registers C and D, the multiplexers Fmux1 and Fmux8, the multiplexers Fmux2 and Fmux7, the multiplexers Fmux3 and Fmux6, and the multiplexers Fmux4 and Fmux5 are respectively symmetrical, and in the two configuration modes of the FCMs, the control signal values of each group of symmetrical multiplexers are exactly the same, so the configuration signals can be shared.

The FCM has flexibility and configurability which can be acquired in the design stage or use stage of the FCM. The design stage of the FCM refers to that desired lines inside the FCM are selected based on the complete flexible configurable module FCM according to actual needs, and undesired parts can be directly removed. For example, when in an actual circuit, the FCM needs to be configured such that FCM_Top_Y to FCM_Bottom_Y is in the register and latch included mode, and the mode and the data transmission direction are changeless, the mode and the line can be directly selected in the design stage, and unused parts of the circuit can be removed, and the corresponding structure diagram is shown in FIG. 4(d). FIG. 4(e) is of a structure designed to be unidirectionally upward and in the register and latch included mode.

The FCM based scan chain test design of the chiplet test circuit provided by the present disclosure is shown in FIG. 1, and the circuit adopts a horizontal multi-line transmission design. In FIG. 1, the FCM_Bottom_Y port of FCM7 is connected to the SI port below the interposer, the FCM_Top_Y port is connected to the scan in port si2 of chip2, and the FCM_To_Right port of FCM7 is connected to the FCM_From_Left port of FCM8. Similarly, FCM8, FCM9, FCM10, FCM11 and FCM12 in the horizontal direction are mutually connected to the ports of adjacent modules to form an FCM chain. The transmission line where the FCM_To_Right and FCM_From_Left ports are located is a scan in line, and the transmission line where the FCM_From_Right and FCM_To_Left ports are located is a scan input line. In a scan test, each FCM in FIG. 1 transmits scan in test data horizontally to the left, and simultaneously transmits scan out data to the right, independent of each other without interference.

When the scan chain of chip1 is tested, the scan test of chip 1 can be completed only by configuring the FCM_Top_Y port of FCM9 to be switched on upwards, the FCM_Top_Y port of FCM10 to be switched on downwards, and the FCM_Top_Y ports of the other FCMs to be kept in the switch off state, and then configuring that FCM7, FCM8 and FCM9 are turned on horizontally to the left and FCM8, FCM9 and FCM10 are turned on horizontally to the right at the same time. In a similar way, the test on chip0 and chip2 can be completed.

(2) Control Signal Configuration Module

Referring to FIG. 1, a control signal configuration module is customized based on the IEEE 1149.1 standard in the present disclosure, which assigns a test instruction as Chiplet_TEST, and when a 3-digit test instruction 111 is input, the circuit will enter the chiplet test mode.

Figure 6:
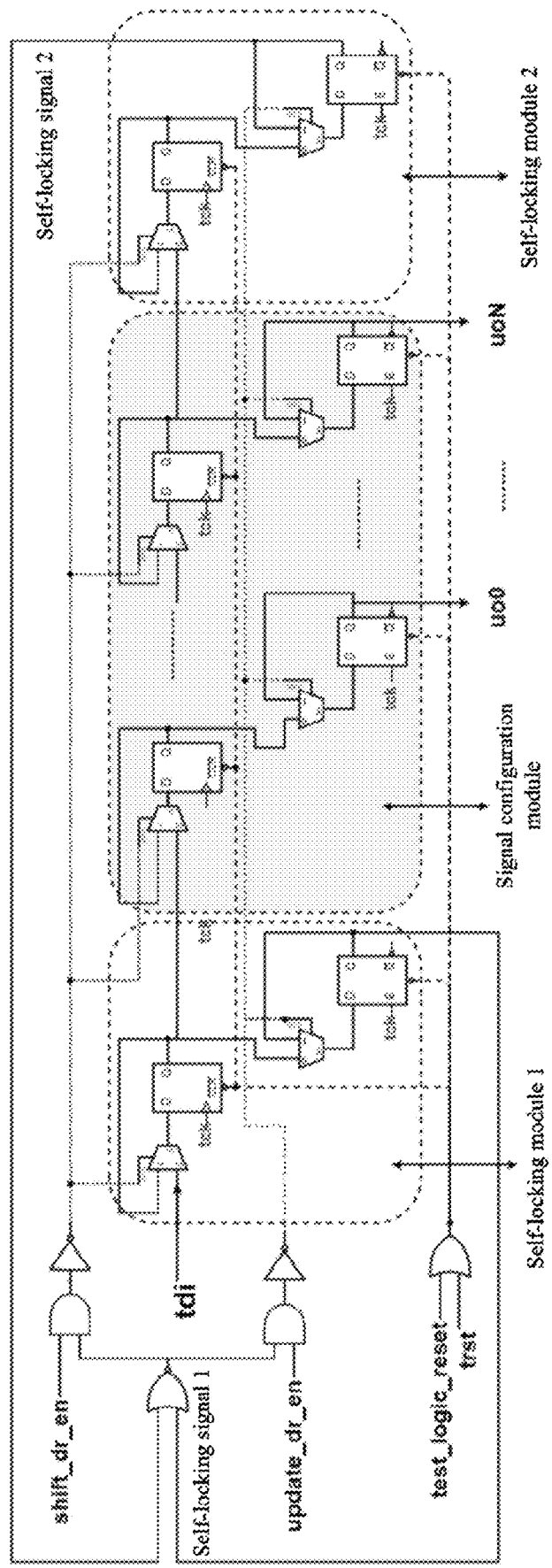
FIG. 6 is a schematic structural diagram of the control signal configuration module according to the present disclosure.

Referring to FIG. 6 for the control signal configuration module, the control signal configuration module mainly includes a self-locking module 1, a signal configuration module and a self-locking module 2 that are connected in series; the signal configuration module is formed by connecting a plurality of test data register units in series, each test data register unit is composed of a register and a latch that are connected in series, the output of the register is connected to the input of the next-stage latch at the same time, and the output of the latch is connected to the control signal of the FCM; and the output of the register in the test data register unit at each stage is also connected to the input of the test register at the next stage.

The self-locking module 1 and the self-locking module 2 are one-bit test data register units, which are respectively located at the head end and tail end of the control signal module, and used for the shift (shift_dr_en) and update (update_dr_en) enable signals of the control signal so as to keep the stability of the configuration signals of the FCM. The self-locking module 1 and the self-locking module 2 are optional modules; when there are more signals in the signal configuration module, the entire control signal configuration module will become longer, so the transmission path of the enable signal of the self-locking module 2 at the tail end becomes longer, so that a delay in a latch enable signal occurs, and the shift and update signals cannot be turned off in time. Therefore, at this time, the self-locking module 1 can also be enabled simultaneously. Since the self-locking module 1 is located at the head end of the module, the transmission delay of the latch enable signal can be ignored, so the self-locking module 1 can activate the enable signal more effectively. Moreover, when the signal configuration module is short, that is, the transmission delay of the latch enable signal of the self-locking module 2 can be ignored, the self-locking module 1 and the self-locking module 2 can be selected arbitrarily.

Latch signals and configuration signals are shifted in the self-locking module 1, the signal configuration module and the self-locking module 2 respectively through tdi, and the shift and update statuses of the data are controlled by two signals shift_dr_en and update_dr_en. Self-locking signals of the self-locking module 1 and the self-locking module 2 are respectively connected to two input ends of a NOR gate, alternatively, the output of the NOR gate, as well as shift_dr_en and update_dr_en signals, is separately connected to the input end of an AND gate respectively, two separate output ends of the AND gate are connected to the input of an inverter, and the output of the inverter is connected to the selection signal end of the multiplexer in FIG. 6. Each register is configured to serially shift in the configuration signals, and the latch is configured to latch the configuration signals, where the output configuration signals are uo0, uo1 . . . uoM, which are respectively connected to the control signals of the FCM.

After the power-on reset of the self-locking module in the control signal configuration module is achieved, the initial default output value is 0; the self-locking module is invalid in a shift state; and when the self-locking module is in an update state, a self-locking signal is loaded into the self-locking module, and a self-lock function is enabled. When shift_dr_en=1, the self-locking module is in the shift state; when update_dr_en=1, the self-locking module is in the update state; and all the state transitions are switched through the 8-bit state machine in the test state control module. The basic principle is to serially shift a M-bit configuration signal and a 2-bit self-locking signal in a corresponding register through tdi, and after the data is stable, activate an update instruction to shift the configuration signal and the self-locking signal in each latch for latching and holding the configuration signal. Here, the value of the self-locking signal needs to be configured as 1, and becomes 0 after inversion, and the updat_dr_en and shift_dr_en signals can be automatically turn off.

(3) Test State Control Module

Figure 9:
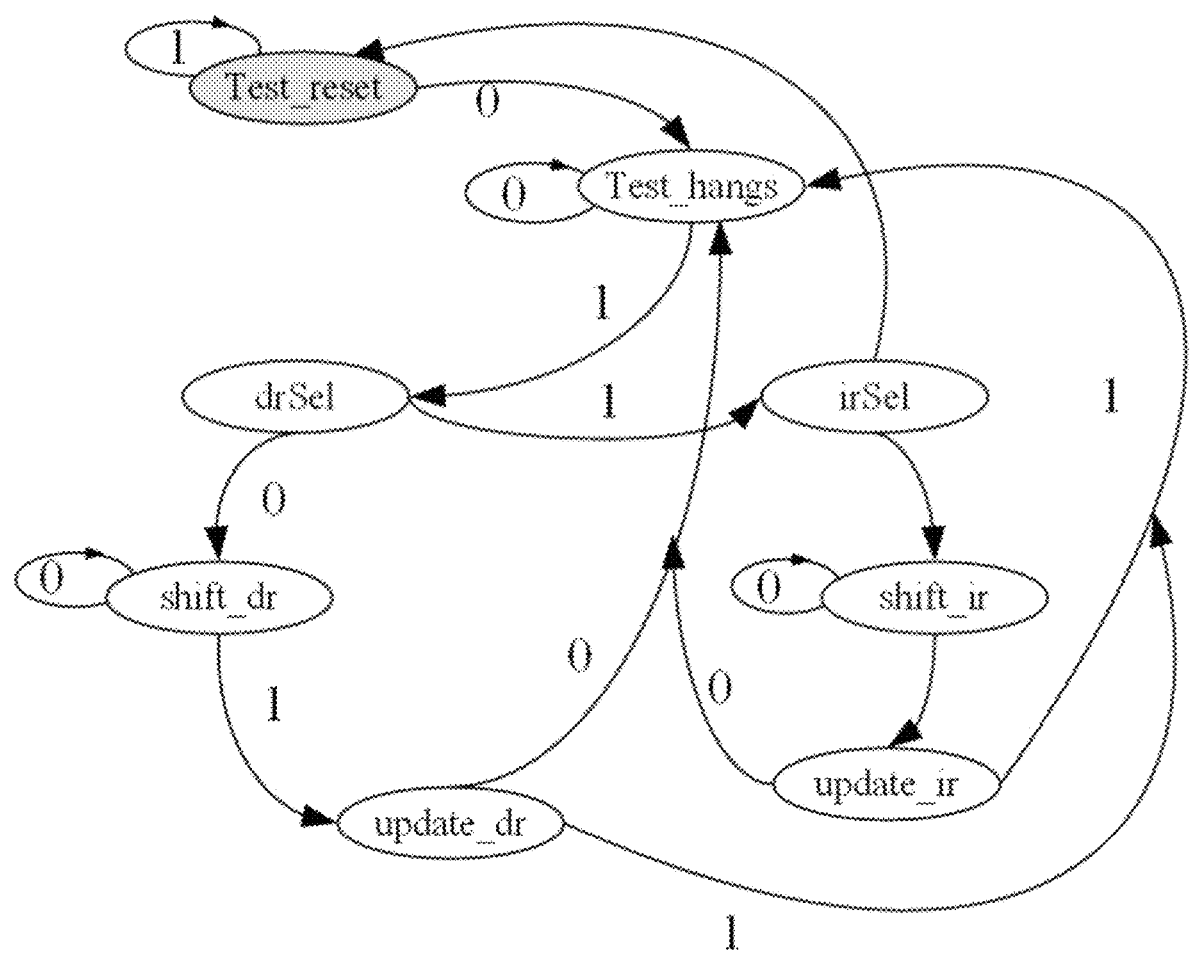
FIG. 9 is a test control state transition diagram of the FCM based chiplet test circuit according to embodiments of the present disclosure.

The test state control module mainly includes an 8-bit test control finite state machine and an instruction register module; the state transitions of all circuits in the interposer are implemented through TC_FSM, and the state transition of the test control finite state machine is shown in FIG. 9. The state machine has eight states Test_rest, Test_hangs, drSel, shift_dr, update_dr, irSel, shift_ir, and update_ir. TC_FSM decodes received TMS and TCK signals, and generates a required operation sequence to control the circuit to enter corresponding test modes. All state switching of TC_FSM is based on the value of TFMS when the rising edge of TCK arrives, and all test logic changes of the circuit are performed at the rising or falling edge of TCK.

Here, Test_reset is an initial state bit; when the state machine is in the Test_reset state, the test logic is in an invalid state, and the circuit is in the normal working mode; when the rising edge of TCK arrives and TMS is kept at a high level all the time, the state machine will always be kept in the test reset state; and when TMS is switched to be at a low level, the state machine will enter the Test_hangs state. Regardless of the original state of TC_FSM, as long as TMS is kept at a high level for a minimum of four or more clock cycles at the rising edge of TCK, TC_FSM will enter the Test_reset state.

Test hangs is a test hang state. In this state, only when there is a test instruction input, a test state transition will be performed, otherwise, the circuit will be kept in the current test state unchanged. When TMS is kept at a low level, the state machine will always be in this state. If TMS is at a high level and the rising edge of TCK appears, TC_FSM will enter the drSel state.

The drSel state is a temporary state of TC_FSM, and once in this state, the test data register selected by the instruction at this time is kept in the previous state. When TC_FSM is in this state, once the rising edge of TCK appears, if TMS is kept at a low level, TC_FSM will enter the shift_dr state, and when TMS is kept at a high level, TC_FSM will enter the irSel state.

When TC FSM is in the shift_dr state, the shift enable signal shift_dr_en is activated, and the data starts to shift from TDI to TDO. When the rising edge of TCK arrives, if TMS is kept at a low level, the data from TDI to TDO will continue to shift, and if TMS is kept at a high level, TC_FSM will enter the update_dr state.

The update_dr state is a refresh state of the data latch. TC_FSM in this state can shift the value in the shift register to the latch of the test data register, and update_dr_en is activated. This process needs to be completed at the falling edge of TCK. When FC_FSM is in the update_dr state and the rising edge of TCK appears, if TMS is kept at a low level, TC_FSM will return to the Test hangs state, and when TMS is kept at a high level, TC_FSM will be switched to the drSel state.

The irSel state is a temporary state, and when in the irSel state, the test data register selected by a current instruction is kept in the previous state. When TC_FSM is in this state and TCK has a rising edge, if TMS is kept at a low level, TC_FSM will enter the shift_ir state, and if TMS is kept at a high level, TC_FSM will return to the Test reset state.

When TC_SM is in the shift_ir state, the test instruction will be shifted in the instruction register module through TDI. When the rising edge of TCK appears and TMS is kept at a low level, the shift register in the register module will be in the shift state, and if TMS is kept at a high level, TC_FSM will enter the update_ir state.

When TC_FSM is in the update_ir state, the data is updated and latched from the register of the instruction register module to a corresponding latch at the falling edge of TCK, and when a new instruction is latched, it will become the current instruction. When in the update_ir state, if the rising edge of TCK arrives and TMS is kept at a low level, TC_FSM will return to the Test_hangs state, and when TMS is kept at a high level, TC_FSM will return to the drSel state.

Embodiment 3

To better verify and explain the technical effect and feasibility of the method of the present disclosure, in this embodiment, a simulation experiment is performed on the control signal configuration module of the FCM first, and then, a simulation verification is performed on the proposed chiplet. The chiplet is composed of chip0, chip1 and chip2. Here, chip1 includes an ISCAS reference circuit s1423, and chip0 and chip2 include a 16K*8-bit SRAM memory. By comparing test results obtained before and after chip integration, the real effect of the method of the present disclosure is verified.

(1) Simulation Experiment on the Control Signal Configuration Module of the FCM

The register and latch excluded mode of the FCM and the configuration information of the transmission direction from FCM_Bottom_Y to FCM_Top_Y are shown in FIG. 7. In FIG. 7, FCM_Bottom_En1, FCM_Bottom_En2, FCM_Top_En1, FCM_Top_En2, From_Left_En1, From_Left_En2, To_Right_En1, To_Right_En2, From_En_Right_En1, From_Right_En1, From_Right_En1 and From_Right_En1 signals are respectively connected to ports u0 to u11 of the control signal configuration module in sequence, and the corresponding enable value is 101010001101, where the enable values of the self-locking signal 1 and the self-locking signal 2 are 1.

Figure 8:
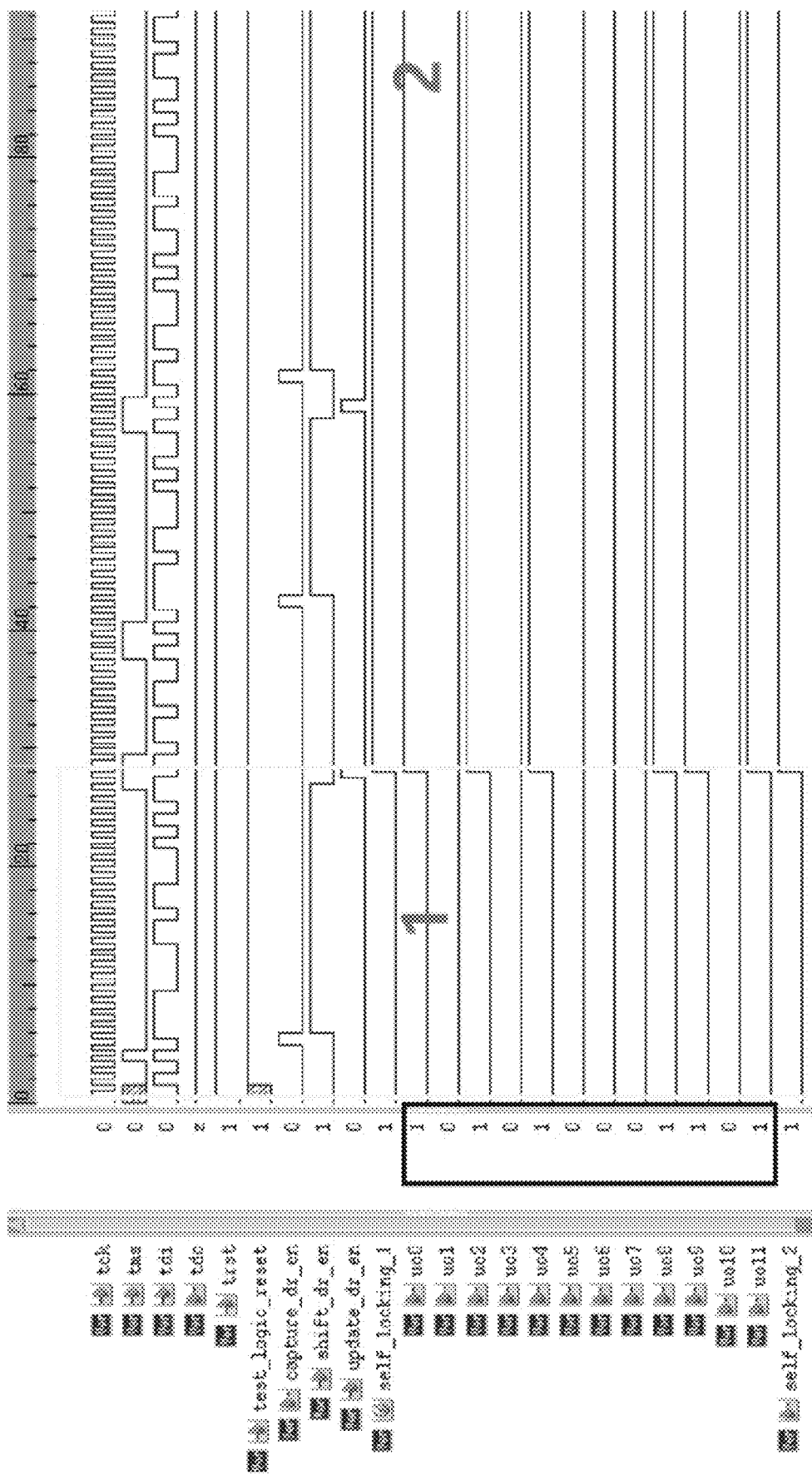
FIG. 8 is a simulation diagram of the control signal configuration module of the CM based chiplet test circuit according to embodiments of the present disclosure.

As shown in the waveform diagram of FIG. 8, the value of uo1 to uo11 in the left block is 101010001101, and the values of the self-locking signal 1 (self_locking_1) and the self-locking signal 2 (self_locking_2) are 1, which are consistent with the configuration information in FIG. 7. Here, the first part is the configuration process, and the input of tdi in the first part is the configuration information and the values of the self-locking signals, at this time, all the control signals of the FCM are 0 by default. When the update_dr_en signal is activated after the configuration is completed, all the control signals are updated to the latches, the self-locking module is activated, and all the signals are latched and kept stable. The second part of the waveform diagram shows that after the self-locking signal is activated, the output values of all the ports from uo1 to uo12 are kept stable. This experiment verifies that the control signal configuration module of the chiplet achieves the unidirectional upward transmission control of the register and latch excluded mode of the FCM.

(2) Simulation Experiment on the Scan Test of Chip1 in the Chiplet

With a test on a scan chain of chip1 in FIG. 1 as an example, a simulation waveform of the scan test before the chip chip1 is integrated is shown in FIG. 10(a), and a test result after the chip chip1 is integrated is shown in FIG. 10(b). Before the scan chain in chip1 after integration is tested, the FCM needs to be configured first, and before the configuration is completed, the value input in the scan test is null, so it is necessary to add a delay in an original scan test simulation circuit to ensure that the configuration of the FCM is completed within the delay time. Block 1 in FIG. 10(b) shows the configuration information for the FCM, and block 2 shows that the test_si1 input of chip1 is null before the configuration of the FCM is completed, and the data is input only after the configuration is completed. The test process is as follows:

1) configuration of the FCMs: all the FCMs connected to a scan test port are configured, the test_si1 and test_so1 lines of chip1 are kept in the switch on state, and the scan test input and output ports of chip0 and chip2 are kept in the switch off state;
2) a test stimulus is input, and after the configuration of the FCMs is completed, the original testfile with the delay time added is input to test; and
3) observation and analysis of test results: it can be observed from FIG. 10(b) that test_si1, test_so1 and test_se1 signals in chip1 are turned on, and test data can be input normally, and the scan in and scan out in chip0 and chip2 are both in the switch off state, and the test_se signal is transmitted normally;

By comparing the simulation waveforms in FIG. 10(a) and FIG. 10(b), it can be found that the scan test waveform outside the block of FIG. 10(b) is exactly the same as that in FIG. 10(a), so it can be determined that the test results of the chip before integration and the chip after integration are completely consistent, which verifies the correctness and feasibility of the design.

(3) Simulation Experiment on the Memory Test of Chip0 in the Chiplet

Figure 11A:
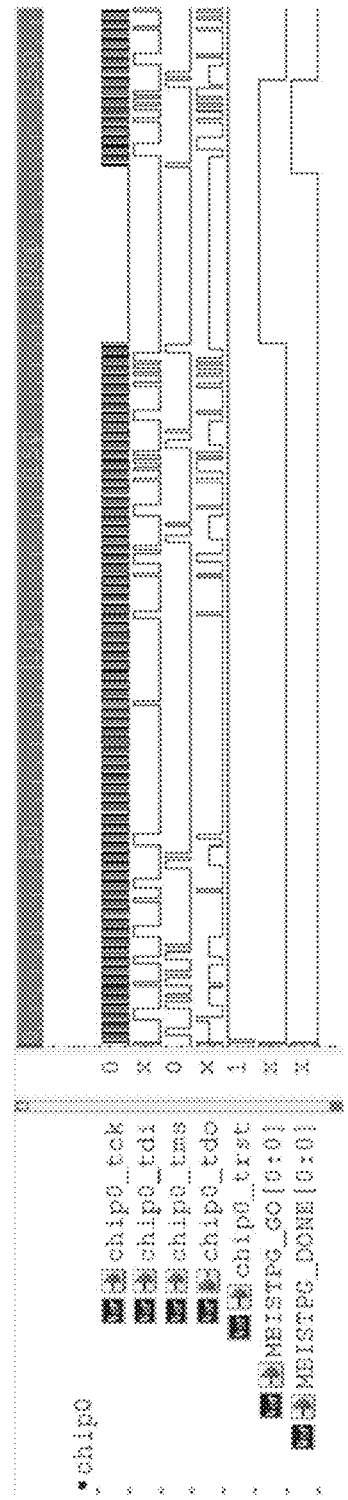
FIG. 11(a) is a simulation diagram of a memory test on chip0 before integration in the chiplet of the FCM based chiplet test circuit according to embodiments of the present disclosure.
Figure 11B:
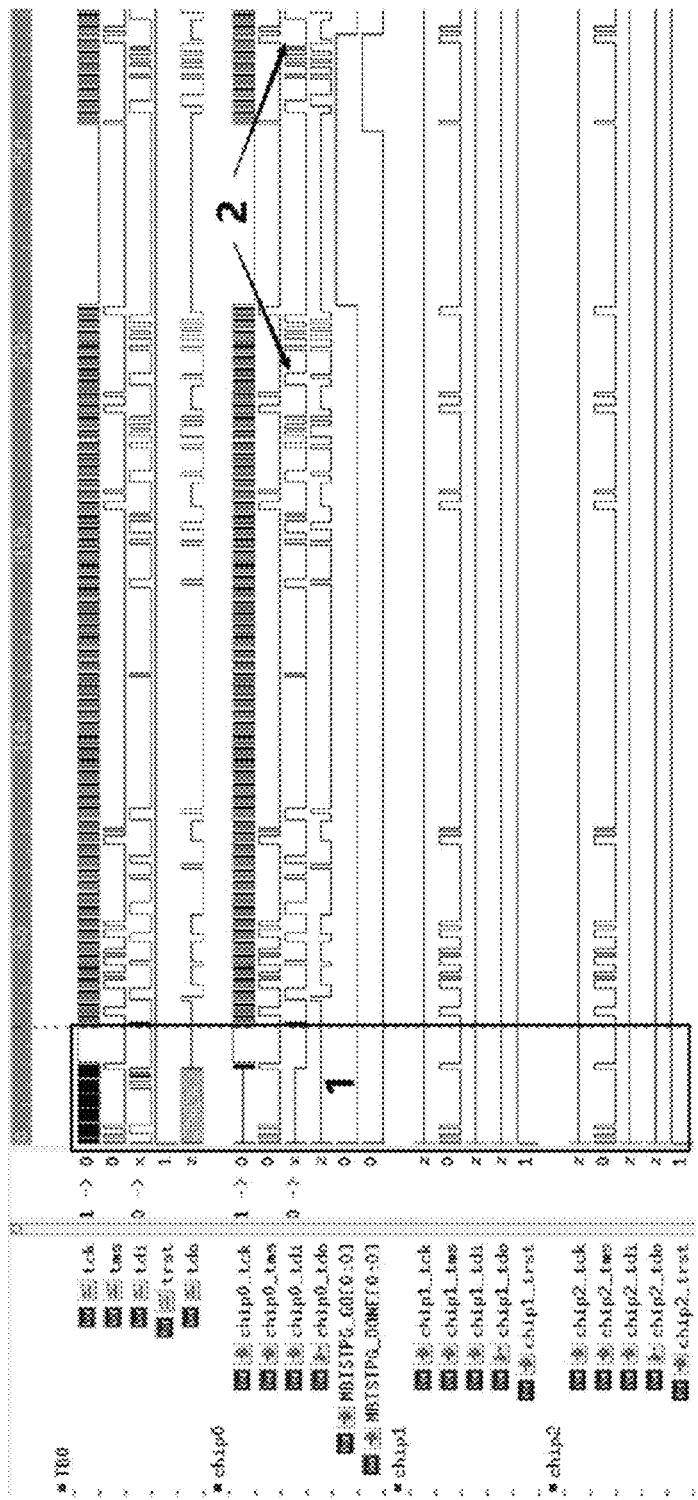
FIG. 11(b) is a simulation diagram of a memory test on chip0 after integration in the chiplet of the FCM based chiplet test circuit according to an embodiment of the present disclosure.

With a test on a memory in chip0 as an example, FIG. 11 (a) is a test simulation diagram of chip0 before integration, and FIG. 11(b) is a test simulation diagram after integration. It is known that there is already an IEEE 1687-based memory built-in self-test circuit inside chip0 before integration, and the circuit still reuses the original test logic. The basic test process is as follows:

1) configuration of the FCMs: FCM1 and FCM2 below chip0 are configured as a transmission path that is switched on upwards and does not contain registers and latches, and a transmission path from tdi and tck below the interposer to tdi and tck of chip0 is kept in a switch on state. The tdi and tck of chip1 and chip2 are kept in a switch off state and cannot receive signals. It can also be observed from the simulation waveform in FIG. 11(b) that tdi and tek in chip0 can transmit data normally, and tdi and tck in chip1 and chip2 cannot transmit data, thereby avoiding unnecessary loss of test power consumption. The first part of a testfile TB0 in FIG. 11(b) corresponds to test instructions and configuration signals. Chip0 has not entered the test state, and at this time, tdi is in a high-impedance state. After the FCM is configured, chip0 starts to test the memory;

2) input of a test stimulus: after the FCMs are configured, original memory test data starts to be input. The testfile here reuses an original testfile of chip0, delay information is added in the testfile only, and the delay time corresponds to the first part of the waveform; and
3) observation and analysis of test results: from the second part of FIG. 11(b), it can be observed that the GO and DONE signals in chip0 can be pulled up normally, and the test on the memory in chip0 after integration is completed;

Through observation, it can be found that the simulation waveform of chip0 outside the block of FIG. 11(b) is completely consistent with that in FIG. 11(a), that is, the test results of the chip before and after integration are the same. The above two test results effectively verify the correctness and feasibility of this design. Simulation results show that the circuit can realize the reconstruction and reuse of existing DFT hardware, and satisfy the plug-and-play strategy.

The experimental results illustrate the feasibility and practicability of this patent. The FCM based chiplet test circuit can realize the reuse of the original DFT logic, meet the horizontal dual-line test requirements and the plug-and-play strategy, enhance the flexibility and controllability of the test, and provide a bran-new method for the design of testability for chiplets.

The FCM based chiplet test circuit provided by the present disclosure can meet the test requirements of chiplets in various scenes, realize the reuse of original DFT test logics, satisfy a plug-and-play strategy of chiplets, and enhance the flexibility and controllability of tests.

The description of the present disclosure is provided for the purpose of illustration and description, and is not intended to be exhaustive or to limit the present disclosure to the forms disclosed. Many modifications and variations will be apparent to those of ordinary skill in the art. The embodiments are chosen and described to better describe the principle and practical application of the present disclosure, and to enable those of ordinary skill in the art to understand the present disclosure and then design various embodiments with various modifications suitable to specific uses. The above descriptions are only preferred solutions of the present disclosure, and are not intended to further limit the present disclosure. All equivalent changes made from the description and drawings of the present disclosure are within the scope of protection of the present disclosure.

What is claimed is:

1. A flexible configurable module (FCM) based chiplet test circuit, characterized in that the test circuit is located at an interposer, and the test circuit comprises a plurality of FCMs, a control signal configuration module and a test state control module;
   a plurality of mini-chips to be tested are provided in a chiplet, and some test signals of the mini-chips to be tested are respectively connected to upper ports of corresponding FCMs; and some test signals of an outer layer of the chiplet are connected to lower ports of corresponding FCMs;
   the test state control module is connected to the control signal configuration module, and sends test control signals to implement the configuration of control signals in the control signal configuration module and then control the data transmission directions of the FCMs and the switch on or switch off of the FCMs, so that the mini-chips to be tested enter different test modes;
   the number of the FCMs of the interposer circuit is 4N, where N is the number of the mini-chips to be tested in the chiplet, and N is a positive integer;
   test data in tdi, test clock tck, scan out so and scan in si signals of each mini-chip to be tested are respectively connected to the upper port of one FCM, and the lower port of the FCM connected to the tck signal is directly connected to a TCK port at the outer layer of the chiplet; the lower port of the FCM connected to the tdi signal of the first mini-chip to be tested is connected to a TDI port at the outer layer of the chiplet; the lower ports of the FCMs connected to the tdi signals of the other mini-chips to be tested are connected to an output end of a 1-of-2 multiplexer of the previous-stage mini-chip to be tested; an output of the next-stage mini-chip to be tested tdo is connected to an input end of a current-stage 1-of-2 multiplexer, the other input port of the current-stage multiplexer is connected to an output port of the previous-stage 1-of-2 multiplexer, a control signal of the current-stage 1-of-2 multiplexer is connected to an output end of a current-stage inverter, an output end of a last-stage multiplexer is connected to an input port of a 1-of-3 multiplexer 3Mux, and an output end of the 1-of-3 multiplexer is connected to a TDO signal of the outer layer of the chip; the lower port of the FCM connected to the si signal of the last mini-chip to be tested is connected to a SI signal of the outer layer of the chiplet; the lower port of the FCM connected to the so signal of the last mini-chip to be tested is connected to a SO signal of the outer layer of the chiplet; the input ports and output ports in the horizontal direction of two adjacent FCMs connected to the so and si signals of the mini-chip to be tested are interconnected; and tins, trst and se signals of all the mini-chips to be tested are directly connected to TMS, TRST and SE signals of the outer layer of the chiplet; and
   the FCM is of a two-way skew-symmetric structure, an axis of symmetry of the FCM is a connecting line of the FCM_To_Right and FCM_To_Left ports, and when a horizontal bidirectional transmission mode is adopted, the control signal of the upper left part of the FCM is exactly the same as the control signal of the lower right part.

2. The FCM based chiplet test circuit according to claim 1, wherein an input end of the control signal configuration module is connected to a TDI signal of the outermost layer of the chiplet, and an output port of the control signal configuration module is connected to an input port of the 1-of-3 multiplexer 3Mux; and the control signal configuration module contains a plurality of output control signals, all the control signals are respectively connected to the control signal of each FCM and input ports of all the inverters, and shift and update enable signals inside the control signal configuration module are connected to the test state control module.

3. The FCM based chiplet test circuit according to claim 2, wherein an input end of the test state control module is connected to the TDI, TRST, TMS and TCK signals of the outer layer of the chiplet, and an output end of the test state control module is connected to an input port of the 1-of-3 multiplexer 3Mux; and the test state control module is connected to the control signal configuration module, and sends control signals to implement the shift and update operations of data in the control signal configuration module to complete the configuration of the control signals, and then control the data transmission directions of the FCMs and the switch on or switch off of the FCMs.

4. The FCM based chiplet test circuit according to claim 3, wherein the test state control module comprises an 8-bit test control finite state machine TC_FSM and an instruction register module;

the test control finite state machine TC_FSM comprises five ports, selected from TMS, TCK, TRST, TDI and TDO ports, receives signals of the TMS and TCK ports to produce decodes, and generates a test control sequence to control the shift-in, shift-out and update operations of data in the instruction register and the control signal configuration module;

an input of the instruction register module is connected to a TDI port at the outer layer of the chiplet, an output thereof is connected to an input end of the 1-of-3 multiplexer 3Mux, and the instruction register module stores chiplet test instructions and outputs the control signal of 3Mux.

5. The FCM based chiplet test circuit according to claim 4, wherein the test control finite state machine TC_FSM has eight transition states, selected from Test_rest, Test hangs, drSel, irSel, shift_dr, update_dr, shift_ir and update_ir states; all state transitions are based on a value of TMS at the rising edge of TCK, and all test logic changes of the circuit are performed at the rising or falling edge of TCK.

6. The FCM based chiplet test circuit according to claim 5, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

7. The FCM based chiplet test circuit according to claim 4, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

8. The FCM based chiplet test circuit according to claim 3, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

9. The FCM based chiplet test circuit according to claim 2, wherein the control signal configuration module comprises a self-locking module 1, a signal configuration module and a self-locking module 2 connected in series in sequence, where the self-locking module 1 is located at the initial input end of the control signal configuration module, and the self-locking module 2 is located at the tail end of the control signal configuration module;

the signal configuration module is formed by connecting a plurality of test data register units in series, the number of output signals is determined based on the actual configured number of signals, and all the control signals are respectively connected to the control signal ends of corresponding FCMs; and both the self-locking module 1 and the self-locking module 2 are 1-bit test data register units, and the self-locking module 1 and the self-locking module 2 control the shift and update operations of data in the signal configuration module.

10. The FCM based chiplet test circuit according to claim 9, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

11. The FCM based chiplet test circuit according to claim 2, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

12. The FCM based chiplet test circuit according to claim 1, wherein the outside of the FCM is provided with six ports, selected from FCM_Top_Y, FCM_Bottom_Y, FCM_To_Right, FCM_From_Left, FCM_From_Right and FCM_To_Left ports; where the FCM_Top_Y and FCM_Bottom_Y ports at the upper and lower ends of the FCM are bidirectional transmission ports; the FCM_From_Left and FCM_From_Right ports are input ports; and the FCM_To_Right and FCM_To_Left ports are output ports;

the upper left part of the FCM comprises a tri-state gate Tri1, a tri-state gate Tri2, a register A, a latch C, a multiplexer Fmux1, a multiplexer Fmux2, a multiplexer Fmux3 and a multiplexer Fmux4; where the multiplexer Fmux1, the register A, the multiplexer Fmux2, the latch C, the multiplexer Fmux3 and the multiplexer Fmux4 are connected in series from left to right, that is, the output of the previous stage is connected to the input end of the next stage;

one input end of the multiplexer Fmux1 is connected to the FCM_From_Left port; an output of the multiplexer Fmux4 is connected to the FCM_To_Right port; an output end of the tri-state gate Tri1 is connected to the FCM_Top_Y port of the FCM, and an output end of the multiplexer Fmux3 is connected to an input end of the tri-state gate Tri1; and an input end of the tri-state gate Tri2 is connected to the FCM_Top_Y port of the FCM, and an output end of Tri2 is connected to an input end of the multiplexer Fmux4;

the lower right part of the FCM comprises a tri-state gate Tri3, a tri-state gate Tri4, a register B, a latch D, a multiplexer Fmux5, a multiplexer Fmux6, a multiplexer Fmux7 and a multiplexer Fmux8; where the multiplexer Fmux8, the latch D, the multiplexer Fmux7, the register B, the multiplexer Fmux6 and the multiplexer Fmux5 are connected in series from right to left, that is, the output of the previous stage is connected to the input end of the next stage;

all of the multiplexer Fmux1, the multiplexer Fmux2, the multiplexer Fmux3, the multiplexer Fmux4, the multiplexer Fmux5, the multiplexer Fmux6, the multiplexer Fmux7 and the multiplexer Fmux8 are 1-of-2 multiplexers; and one input end of the multiplexer Fmux8 is connected to the lower port FCM_From_Right of the FCM, and the other input port is connected to an output port of the multiplexer Fmux4; an output port of the multiplexer Fmux5 is respectively connected to the FCM_To_Left port and the other input port of the multiplexer Fmux1; an input end of the tri-state gate Tri3 is connected to the lower port FCM_Bottom_Y of the FCM, and an output end thereof is connected to an input port of the multiplexer Fmux5; and an output end of the tri-state gate Tri4 is connected to the lower port FCM_Bottom_Y of the FCM, and an input end thereof is connected to an output end of the multiplexer Fmux6.

13. The FCM based chiplet test circuit according to claim 12, wherein the FCM has 12 control signals, where FCM_Top_En1, FCM_Top_En2, FCM_Bottom_En1 and FCM_Bottom_En2 are respectively the control signals of the tri-state gate Tri1, the tri-state gate Tri2, the tri-state gate Tri3 and the tri-state gate Tri4 to realize the bidirectional transmission of the FCM_Bottom_Y and FCM_Top_Y ports in the vertical direction of the FCM; From_Left_En1, FCM_Left_En2, To_Right_En2, To_Right_En1, To_Left_En2, To_Left_En1, From_Right_En2 and From_Right_En1 are respectively the control signals of the multiplexer Fmux1, the multiplexer Fmux2, the multiplexer Fmux3, the multiplexer Fmux4, the multiplexer Fmux5, the multiplexer Fmux6, the multiplexer Fmux7 and the multiplexer Fmux8; and by controlling control end signals of each multiplexer and tri-state gate, the switching of different modes and test lines of the FCM is realized.

14. The FCM based chiplet test circuit according to claim 13, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

15. The FCM based chiplet test circuit according to claim 12, wherein the FCM internally comprises a plurality of transmission lines, and according to the selection of the transmission lines, a register and latch excluded mode and a register and latch included mode are comprised; the register and latch excluded mode represents that all the transmission lines inside the FCM are configured be in the excluded mode; and the register and latch included mode has two configurations, one configuration is that some transmission lines are configured to be in the register and latch included mode, and the remaining transmission lines are configured be in the register and latch excluded mode, and the other configuration is that all the transmission lines are configured to be in the register and latch included mode.

16. The FCM based chiplet test circuit according to claim 15, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

17. The FCM based chiplet test circuit according to claim 12, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

18. The FCM based chiplet test circuit according to claim 1, wherein the test from the circuit comprises the following steps:

step 1: selecting a mini-chip to be tested as a target mini-chip;

step 2: configuring an FCM, turning on a test path of the target mini-chip and turning off test paths of the other mini-chips to be tested;

step 3: reusing an original testfile to perform a memory test, a scan test and a boundary scan test on the target mini-chip;

step 4: after the test on the target mini-chip is completed, switching to the other mini-chips to be tested to continue the test; and step 5: determining whether the test on all the mini-chips to be tested is completed, if not, repeating the above steps to continue the test until the test on all the mini-chips to be tested is completed.

* * * * *